United States Patent
Kodama

(10) Patent No.: US 12,262,131 B2
(45) Date of Patent: Mar. 25, 2025

(54) IMAGING DEVICE AND IMAGING METHOD

(71) Applicant: SONY SEMICONDUCTOR SOLUTIONS CORPORATION, Kanagawa (JP)

(72) Inventor: Kazutoshi Kodama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 204 days.

(21) Appl. No.: 17/794,011

(22) PCT Filed: Jan. 14, 2021

(86) PCT No.: PCT/JP2021/001050
§ 371 (c)(1),
(2) Date: Jul. 20, 2022

(87) PCT Pub. No.: WO2021/153254
PCT Pub. Date: Aug. 5, 2021

(65) Prior Publication Data
US 2023/0047180 A1    Feb. 16, 2023

(30) Foreign Application Priority Data
Jan. 31, 2020 (JP) ................. 2020-015168

(51) Int. Cl.
*H04N 25/75* (2023.01)
*H04N 25/772* (2023.01)
*H04N 25/79* (2023.01)

(52) U.S. Cl.
CPC ........... *H04N 25/75* (2023.01); *H04N 25/772* (2023.01); *H04N 25/79* (2023.01)

(58) Field of Classification Search
CPC ...... H04N 25/75; H04N 25/772; H04N 25/79; H04N 25/47; H04N 25/707; H04N 25/77;
(Continued)

(56) References Cited

U.S. PATENT DOCUMENTS

| 6,362,482 B1 * | 3/2002 | Stettner ................. G01T 1/1644 |
| | | 257/E27.15 |
| 9,210,337 B2 * | 12/2015 | Juen ....................... H04N 25/70 |

(Continued)

FOREIGN PATENT DOCUMENTS

| EP | 3582491 A1 | 12/2019 |
| JP | 2012049597 A | 3/2012 |

(Continued)

OTHER PUBLICATIONS

International Search Report and Written Opinion prepared by the Japan Patent Office on Mar. 22, 2021, for International Application No. PCT/JP2021/001050, 2 pgs.

*Primary Examiner* — Chiawei Chen
(74) *Attorney, Agent, or Firm* — SHERIDAN ROSS P.C.

(57) ABSTRACT

An imaging device capable of reducing a useless region on a substrate is provided. An imaging device including a plurality of substrates to be stacked includes a readout-only circuit disposed on a substrate different from a substrate having a pixel array unit including a plurality of photoelectric conversion elements disposed thereon, and performing an operation of reading out electrical signals obtained through photoelectric conversion in the plurality of photoelectric conversion elements, and a circuit disposed on a substrate different from the substrate having the readout-only circuit disposed thereon and performing an operation other than an operation of the readout-only circuit on the basis of the electrical signals.

21 Claims, 32 Drawing Sheets

(58) Field of Classification Search
CPC .............. H04N 25/78; H01L 27/14634; H01L 21/3205; H01L 21/768; H01L 23/522; H01L 27/14601
See application file for complete search history.

(56) References Cited

U.S. PATENT DOCUMENTS

| | | | | |
|---|---|---|---|---|
| 9,343,497 | B2* | 5/2016 | Cho | H01L 27/14618 |
| 11,490,038 | B2* | 11/2022 | Okuike | H04N 23/80 |
| 11,763,554 | B2* | 9/2023 | Satoh | G06V 20/10 |
| 11,810,932 | B2* | 11/2023 | Nomoto | H01L 27/14645 |
| 2008/0136002 | A1 | 6/2008 | Yang | |
| 2009/0200478 | A1* | 8/2009 | Bethke | G01T 1/247 250/370.08 |
| 2013/0068929 | A1* | 3/2013 | Solhusvik | H04N 25/79 250/208.1 |
| 2013/0112854 | A1* | 5/2013 | Shimotsusa | H04N 25/766 250/208.1 |
| 2013/0320197 | A1* | 12/2013 | Asayama | H04N 25/68 250/208.1 |
| 2014/0077063 | A1* | 3/2014 | Cho | H01L 27/14618 257/443 |
| 2014/0263959 | A1* | 9/2014 | Hsu | H01L 27/1464 250/206 |
| 2015/0115134 | A1* | 4/2015 | Solhusvik | H04N 25/70 250/208.1 |
| 2015/0156428 | A1 | 6/2015 | Uchida | |
| 2016/0155765 | A1* | 6/2016 | Blanquart | H01L 27/14636 257/292 |
| 2017/0131143 | A1* | 5/2017 | Andreou | H01L 31/02027 |
| 2018/0146145 | A1* | 5/2018 | Arishima | H04N 25/79 |
| 2018/0262705 | A1* | 9/2018 | Park | H04N 25/79 |
| 2019/0098241 | A1* | 3/2019 | Fossum | H04N 25/79 |
| 2019/0104272 | A1* | 4/2019 | Izuhara | H04N 25/673 |
| 2019/0252421 | A1 | 8/2019 | Yoshida | |
| 2019/0348407 | A1 | 11/2019 | Kim | |
| 2019/0373188 | A1* | 12/2019 | Takahashi | H04N 25/77 |
| 2020/0258924 | A1 | 8/2020 | Takachi | |
| 2021/0051284 | A1* | 2/2021 | Panicacci | H04N 25/40 |
| 2021/0321054 | A1* | 10/2021 | Aoki | H04N 23/611 |
| 2022/0377268 | A1* | 11/2022 | Kim | H04N 25/705 |
| 2023/0217128 | A1* | 7/2023 | Wang | H04N 25/78 348/207.99 |

FOREIGN PATENT DOCUMENTS

| | | |
|---|---|---|
| JP | 2013090127 A | 5/2013 |
| JP | 2013110566 A | 6/2013 |
| JP | 2013530511 A | 7/2013 |
| JP | 2014531820 A | 11/2014 |
| JP | 2015-128284 | 7/2015 |
| JP | 2016511539 A | 4/2016 |
| JP | 2016-533140 | 10/2016 |
| JP | 2019510418 A | 4/2019 |
| JP | 2019-134271 | 8/2019 |
| TW | 200427079 A | 12/2004 |
| TW | 200520244 A | 6/2005 |
| WO | WO-2013118646 A1 | 8/2013 |
| WO | WO 2019/087471 | 5/2019 |
| WO | WO-2019087597 A1 | 5/2019 |
| WO | WO-2019087764 A1 | 5/2019 |
| WO | WO-2019130702 A1 | 7/2019 |

* cited by examiner

IMAGING DEVICE AND IMAGING METHOD

CROSS REFERENCE TO RELATED APPLICATIONS

This application is a national stage application under 35 U.S.C. 371 and claims the benefit of PCT Application No. PCT/JP2021/001050, having an international filing date of 14 Jan. 2021, which designated the United States, which PCT application claimed the benefit of Japanese Patent Application No. 2020-015168, filed 31 Jan. 2020, the entire disclosures of each of which are incorporated herein by reference.

TECHNICAL FIELD

The present disclosure relates to an imaging device and an imaging method.

BACKGROUND ART

Conventionally, an imaging device including a synchronous solid-state image sensor that captures image data (frames) in synchronization with a synchronization signal such as a vertical synchronization signal has been generally used. Because the synchronous solid-state image sensor can acquire image data only every cycle (for example, 1/60 of a second) of the synchronization signal, it is difficult to deal with a case in which higher speed processing is required in fields regarding transportation or robots. Therefore, an asynchronous solid-state image sensor in which an address event detection circuit that detects, in real time, a light amount of a pixel exceeding a threshold value for each pixel address as an address event is provided in each pixel has been proposed (for example, PTL 1).

CITATION LIST

Patent Literature

[PTL 1]
Japanese Translation of PCT Application No. 2016-533140

SUMMARY

Technical Problem

The asynchronous solid-state image sensor described above can generate and output data at a much higher speed than the synchronous solid-state image sensor. Therefore, for example, in the field of transportation, it is possible to perform image recognition processing for people or obstacles at a high speed to improve safety. However, the address event detection circuit has a larger circuit scale than a pixel circuit in the synchronous type, and there is a problem that a mounting area increases as compared with the synchronous type when such a circuit is provided in each pixel.

In recent years, with the development of semiconductor integrated circuit technology, it has become possible to stack two substrates and transmit or receive signals at a high speed between the upper and lower substrates. Therefore, it is also possible to configure the imaging device by stacking a substrate on which the address event detection circuit described above is disposed and a substrate on which the pixel array unit is disposed.

However, when there is a large difference between areas of circuits mounted on the two stacked substrates, an external size of a solid-state image sensor is determined by a size of the substrate with a larger circuit area, and there is concern that the size cannot be reduced. Further, because respective circuit portions constituting the solid-state image sensor are related to each other, and the circuit area differs depending on the respective circuit portions, it is not easy for the respective circuit portions to be allocated so that mounting areas of the two stacked substrates are the same. One of the two substrates to be stacked may have a large circuit area, and the other may have a small circuit area and a large free region. Having a large free region on the substrate means that there is much wasted space, which leads to an increase in chip cost.

Therefore, the present disclosure provides an imaging device and an imaging method capable of reducing a useless region on a substrate.

Solution to Problem

In order to solve the above problem, according to the present disclosure, an imaging device including a plurality of substrates to be stacked is provided, the imaging device including:

a readout-only circuit disposed on a substrate different from a substrate having a pixel array unit including a plurality of photoelectric conversion elements disposed thereon, and configured to perform an operation of reading out electrical signals obtained through photoelectric conversion in the plurality of photoelectric conversion elements; and a circuit disposed on a substrate different from the substrate having the readout-only circuit disposed thereon and configured to perform an operation other than an operation of the readout-only circuit on the basis of the electrical signals.

The readout-only circuit may be a circuit configured to convert the electrical signal obtained through photoelectric conversion in the photoelectric conversion element into a voltage signal and perform gain adjustment, and the substrate having a circuit configured to perform the operation other than the operation of the readout-only circuit disposed thereon may perform at least one of processing for converting the voltage signal output from the readout-only circuit into a digital signal in units of two or more pixel groups disposed in a first direction of the pixel array unit, predetermined signal processing for the digital signal, and processing for driving the plurality of photoelectric conversion elements in units of two or more pixel groups disposed in a second direction.

A circuit portion having a power supply voltage exceeding a predetermined reference voltage in the circuit configured to perform the operation other than the operation of the readout-only circuit may be disposed on the same substrate as that for the plurality of photoelectric conversion elements.

The imaging device may include at least a part of an AD unit disposed on the substrate having the pixel array unit disposed thereon and configured to convert a pixel signal read from the readout-only circuit into a digital signal.

The AD unit may convert a pixel signal read from the readout-only circuit into the digital signal in units of two or more pixel groups disposed in a first direction of the pixel array unit.

The AD unit may be divided and disposed on the substrate having the pixel array unit disposed thereon and another substrate.

The imaging device may include a pixel group drive unit disposed on the substrate having the pixel array unit disposed thereon and configured to drive the pixel array unit in units of two or more pixel groups disposed in a second direction.

The pixel group drive unit may be divided and disposed on the substrate having the pixel array unit disposed thereon and another substrate.

The imaging device may include:

a first substrate having the readout-only circuit disposed thereon;

a second substrate stacked on the first substrate and having the pixel array unit disposed thereon; and a third substrate stacked at the same layer height as the second substrate on the first substrate and having at least a part of the circuit configured to perform the operation other than the operation of the readout-only circuit disposed thereon.

The first substrate may be larger than the second substrate, and the second substrate may be larger than the third substrate.

The imaging device may include: a first substrate having the readout-only circuit disposed thereon;

a second substrate stacked on the first substrate and having the pixel array unit disposed thereon; and a third substrate stacked under the first substrate and having at least a part of the circuit configured to perform the operation other than the operation of the readout-only circuit disposed thereon.

The imaging device may include: a fourth substrate disposed at the same layer height as the third substrate, wherein respective parts of the circuit configured to perform the operation other than the operation of the readout-only circuit may be disposed on the third substrate and the fourth substrate.

The second substrate may be larger than the third substrate and the fourth substrate.

The readout-only circuit may be disposed on the first substrate to at least partially overlap the pixel array unit when viewed in a plan view of the first substrate and the second substrate in a stacking direction.

The readout-only circuit may be provided in each of the plurality of photoelectric conversion elements.

The readout-only circuit may be provided in association with two or more of the photoelectric conversion elements.

The pixel array unit and the readout-only circuit may include a change amount detection unit configured to output a detection signal indicating whether or not a change amount of the electrical signal of each of the plurality of photoelectric conversion elements exceeds a predetermined threshold value.

The pixel array unit and the readout-only circuit may include a pixel AD unit configured to convert the electrical signal obtained through photoelectric conversion in each photoelectric conversion element into a digital signal.

The pixel array unit and the readout-only circuit may include a light detection unit configured to detect an incidence position and an incidence time of light incident on the plurality of photoelectric conversion elements.

The imaging device may include:

a first output unit configured to output a first signal from the pixel array unit; and a second output unit configured to output a second signal from the readout-only circuit.

The plurality of substrates may be bonded through at least one of Cu—Cu bonding, through silicon via (TSV), and bump bonding.

The substrate may be a wafer or a semiconductor chip.

According to another aspect of the present disclosure, an imaging method including a plurality of substrates to be stacked is provided, the imaging method including:

performing an operation of reading out electrical signals obtained through photoelectric conversion in a plurality of photoelectric conversion elements in a readout-only circuit disposed on a substrate different from a substrate having a pixel array unit including the plurality of photoelectric conversion elements disposed thereon; and performing an operation other than an operation of the readout-only circuit on the basis of the electrical signals in a circuit disposed on a substrate different from the substrate having the readout-only circuit disposed thereon.

DESCRIPTION OF EMBODIMENTS

Hereinafter, embodiments of an imaging device will be described with reference to the drawings. Hereinafter, main components of the imaging device will be mainly described, but the imaging device may have components or functions that are not illustrated or described. The following description does not exclude components or functions that are not illustrated or described.

First Embodiment

Figure 1:
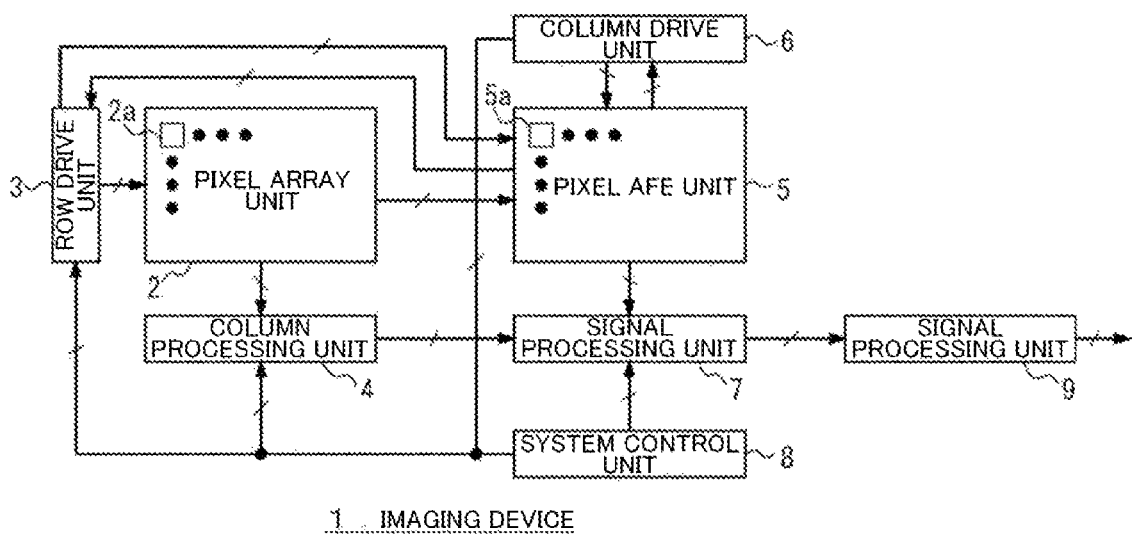
FIG. 1 is a block diagram illustrating a schematic configuration of an imaging device 1 according to a first embodiment.

FIG. 1 is a block diagram illustrating a schematic configuration of an imaging device 1 according to a first embodiment. The imaging device 1 of FIG. 1 includes a pixel array unit 2, a row drive unit 3, a column processing unit 4, a pixel AFE unit 5, a column drive unit 6, a signal processing unit 7, and a system control unit 8. In some cases, the imaging device 1 of FIG. 1 may include an additional signal processing unit 9.

The pixel array unit 2 includes a plurality of pixel circuits 2a disposed in a row direction and a column direction. Each pixel circuit 2a includes a photoelectric conversion element and a readout circuit that reads out an electrical signal obtained through photoelectric conversion in the photoelectric conversion element. The readout circuit is a circuit that transfers the electrical signal obtained through the photoelectric conversion to a pixel analog front end (AFE) unit, which will be described below. More specifically, the readout circuit includes a transfer transistor, and the like.

The row drive unit 3 drives respective rows in the pixel array unit 2 in order. The row drive unit 3 drives the plurality of pixel circuits 2a (hereinafter, a pixel group) connected to the respective rows in the pixel array unit 2 row by row. The row drive unit 3 includes a circuit portion to which a high power supply voltage is supplied, and a circuit portion to which a low power supply voltage is supplied, as will be described below.

The column processing unit 4 reads out output signals of the plurality of pixel circuits 2a (hereinafter, a pixel group) connected to respective columns in the pixel array unit 2 in order and performs analog-to-digital conversion. The column processing unit 4 includes a circuit portion to which a high power supply voltage is supplied, and a circuit portion to which a low power supply voltage is supplied, as will be described below.

The pixel AFE unit 5 performs an operation of reading out an electrical signal obtained through photoelectric conversion in a plurality of photoelectric conversion elements. More specifically, the pixel AFE unit 5 is a readout-only circuit that performs an operation of comparing a voltage signal output from each pixel circuit 2a with a reference signal and performing quantization. The pixel AFE unit 5 includes, for example, a reset transistor, an amplification transistor, and a selection transistor. A power supply voltage supplied to the pixel circuit 2a may differ from a power supply voltage supplied to the pixel AFE unit 5, and for example, a power supply voltage having a voltage level lower than that for the pixel circuit 2a may be supplied to the pixel AFE unit 5.

The pixel AFE unit 5 is provided in association with the pixel array unit 2. As will be described below, in the present embodiment, the pixel AFE unit 5 and the pixel array unit 2 are disposed at vertically overlapping positions in consideration of the fact that the pixel AFE unit 5 is disposed on a substrate different from the substrate on which the pixel array unit 2 is disposed. This makes it possible for the pixel AFE unit 5 and the pixel array unit 2 to transmit or receive signals at a high speed through bonding of the pixel AFE unit 5 with the pixel array unit 2 using Cu—Cu bonding, a through silicon via (TSV), micro bump bonding, or the like.

The pixel AFE unit 5 includes a plurality of sub-AFE units 5a disposed in the row direction and the column direction, similar to the pixel array unit 2. Each sub-AFE unit 5a converts an electrical signal output from the corresponding pixel circuit 2a into a voltage signal and performs gain adjustment. Each sub-AFE unit 5a may perform processing for quantizing the voltage signal.

The column drive unit 6 drives respective columns in the pixel AFE unit 5 in order. The column drive unit 6 sequentially outputs the voltage signals or quantization data output from the plurality of sub-AFE units 5a connected to respective columns in the pixel AFE unit 5 and inputs the voltage signals or quantization data to the signal processing unit 7. The column drive unit 6 includes a circuit portion to which a high power supply voltage is supplied, and a circuit portion to which a low power supply voltage is supplied, as will be described below.

The signal processing unit 7 performs various signal processing on an output signal of the pixel AFE unit 5. The signal processing unit 7 performs, for example, correlated double sampling (CDS) processing or image recognition processing. When the signal processing unit 7 alone cannot perform all signal processing, the additional signal processing unit 9 may be used to perform further signal processing. Further, a memory (not illustrated in FIG. 1) that stores data indicating a result of signal processing performed by the signal processing unit 7 or the additional signal processing unit 9 may be included.

The system control unit 8 controls each unit in the imaging device 1. For example, the system control unit 8 controls a timing at which the row drive unit 3 drives each row of the pixel array unit 2 and a timing at which the column processing unit 4 reads out an output of the pixel circuit 2a in each column of the pixel array unit 2. Further, the system control unit 8 controls a timing at which the column drive unit 6 drives the pixel AFE unit 5 and a timing at which the signal processing unit 7 performs signal processing.

The respective units in the imaging device 1 according to the present embodiment are divided and disposed on a plurality of substrates to be stacked. The present embodiment is characterized in that a free region of each substrate is decreased as much as possible. The substrate in the present embodiment may be a wafer or may be a semiconductor chip (hereinafter simply referred to as a chip). In the present embodiment, any of a wafer on wafer (WoW) scheme for stacking wafers, a chip on wafer (CoW) scheme for stacking a wafer and a chip, and a chip on chip (CoC) scheme for stacking chips may be used.

Because the power supply voltage to be used in the imaging device 1 differs depending on respective circuits inside the imaging device 1, for example, it is conceivable to divide substrates on which the circuits are mounted, depending on power supply voltage levels to be used by the respective circuits. For example, a substrate on which a circuit having a power supply voltage higher than a predetermined reference voltage level is mounted and a substrate on which a circuit having a power supply voltage equal to or lower than the reference voltage level is mounted may be divided.

Further, the imaging device 1 includes, therein, a circuit that handles analog signals and a circuit that handles digital signals. In general, because it is easy for the circuit that handles analog signals to be influenced by noise or the like, it is difficult to micro-fabricate the circuit. On the other hand, there is less concern of electrical characteristics being degraded even when the circuit that handles digital signals is micro-fabricated. Therefore, a substrate on which the circuit that handles analog signals is disposed and a substrate on which the circuit that handles digital signals is disposed are divided, and a circuit may be formed using a micro-fabrication process for the substrate on which the circuit that handles digital signals is disposed. The micro-fabrication of the circuit makes it possible to mount a larger-scale circuit in a substrate and reduce power consumption.

Figure 2A:
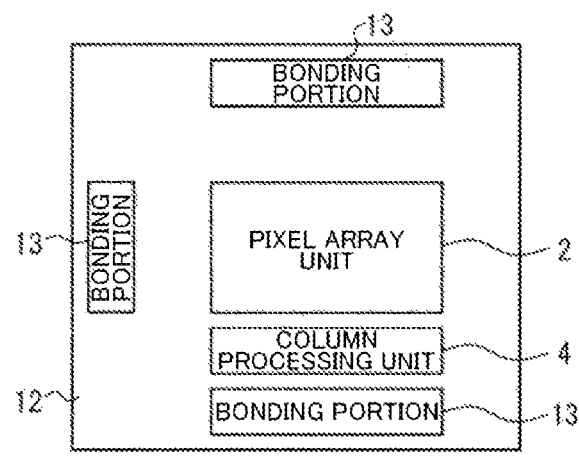
FIG. 2A is a diagram illustrating a first layout example of one of substrates to be stacked.
Figure 2B:
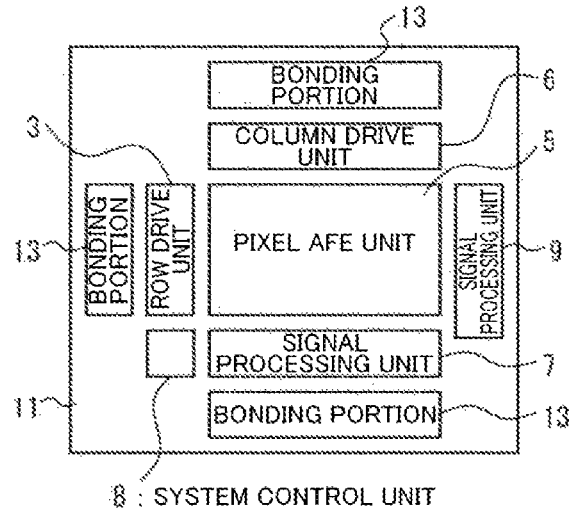
FIG. 2B is a diagram illustrating a first layout example of another substrate to be stacked.

FIGS. 2A and 2B are diagrams illustrating a first layout example of the two substrates 11 and 12 to be stacked. An example in which the substrate 12 of FIG. 2A is stacked on the substrate 11 of FIG. 2B is shown. The substrate 11 in FIG. 2B may be a wafer or a chip. The substrate 12 of FIG. 2A may be a wafer or a chip when the substrate 11 of FIG. 2B is a wafer, but is a chip when the substrate 11 of FIG. 2B is a chip. Thus, the substrate 11 of FIG. 2B has the same size as or a larger size than the substrate 12 of FIG. 2A.

The pixel array unit 2 and the column processing unit 4 are disposed on the substrate 12 of FIG. 2A. The substrate 12 of FIG. 2A and the substrate 11 of FIG. 2B are bonded by a plurality of bonding portions 13. The bonding portion 13 may bond to both of the substrates with an adhesive or the like, or may bond the substrates through Cu—Cu bonding, a TSV, microbump bonding, or the like. Because the substrate 12 of FIG. 2A is stacked on the substrate 11 of FIG. 2B, the substrate 11 of FIG. 2B may be hereinafter referred to as a first substrate 11 and the substrate 12 of FIG. 2A may be hereinafter referred to as a second substrate 12.

An example in which the pixel array unit 2 is disposed in a substantially central portion of the second substrate 12 and the column processing unit 4 is disposed in the vicinity thereof is illustrated in FIG. 2A, but a specific disposition place of the pixel array unit 2 and the column processing unit 4 is arbitrary. However, because the pixel array unit 2 performs transmission and reception of signals to and from the pixel AFE unit 5 disposed on the other substrate as will be described below, it is preferable for the pixel array unit 2 and the pixel AFE unit 5 to be disposed as close as possible. Ideally, when the substrates 11 and 12 are stacked, it is preferable for the pixel array unit 2 and the pixel AFE unit 5 to be disposed to vertically overlap each other. Further, it is preferable for the column processing unit 4 to be disposed in the vicinity of the pixel array unit 2 from the viewpoint of reducing parasitic capacitance or parasitic resistance.

The pixel AFE unit 5, the column drive unit 6, the row drive unit 3, the signal processing unit 7, and the additional signal processing unit 9 are disposed on the first substrate 11 of FIG. 2B. The additional signal processing unit 9 may be omitted.

The pixel AFE unit 5 is disposed at a position vertically overlapping the pixel array unit 2 when viewed in a plan view from a normal direction of a substrate surface in a state in which the two substrates 11 and 12 are stacked. The row drive unit 3 is disposed along a first end surface of the pixel AFE unit 5, the column drive unit 6 is disposed along a second end surface of the pixel AFE unit 5, the signal processing unit 7 is disposed along a third end surface of the pixel AFE unit 5, and the additional signal processing unit 9 is disposed along a fourth end surface of the pixel AFE unit 5. Further, the system control unit 8 is disposed along a corner portion of the pixel AFE unit 5.

As illustrated in FIG. 1, because the signal processing unit 7 performs signal processing using an output of the column processing unit 4, the signal processing unit 7 in the first substrate 11 of FIG. 2B is disposed at a position at which the first substrate 11 vertically overlaps the column processing unit 4 in the second substrate 12 of FIG. 2A. The signal processing unit 7 and the column processing unit 4 are bonded through Cu—Cu bonding, a TSV, microbump bonding, or the like, and perform transmission and reception of various signals. Accordingly, even when the column processing unit 4 and the signal processing unit 7 are disposed on separate substrates, the signal processing unit 7 can rapidly perform signal processing using the output of the column processing unit 4 without being influenced by parasitic capacitance or parasitic resistance.

Thus, not only the pixel array unit 2 but also the column processing unit 4 is disposed on the first substrate 11 of FIG. 2A, making it possible to reduce a free region of the first substrate 11, and making a circuit mounting area of the first substrate 11 close to a circuit mounting area of the second substrate 12. Further, because the circuit mounting area of the second substrate 12 can be reduced, it is possible to reduce a substrate size in any one of the first substrate 11 and the second substrate 12, and to achieve miniaturization of the imaging device 1. Further, because the respective circuits are disposed in signal flow order in both of the substrates 11 and 12, a signal propagation delay time can be shortened and the circuit is also less susceptible to noise.

Figure 3A:
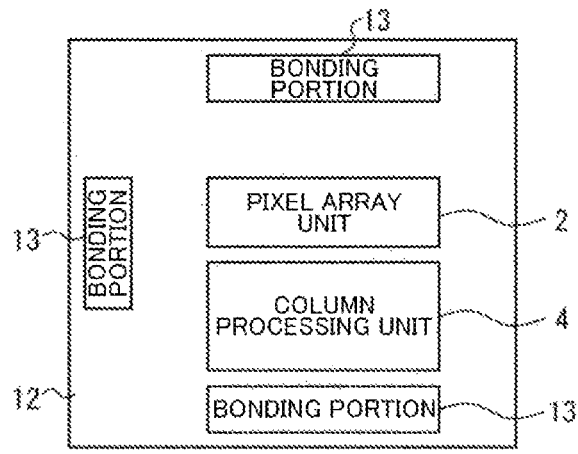
FIG. 3A is a diagram illustrating a second layout example of the one of the substrates to be stacked.
Figure 3B:
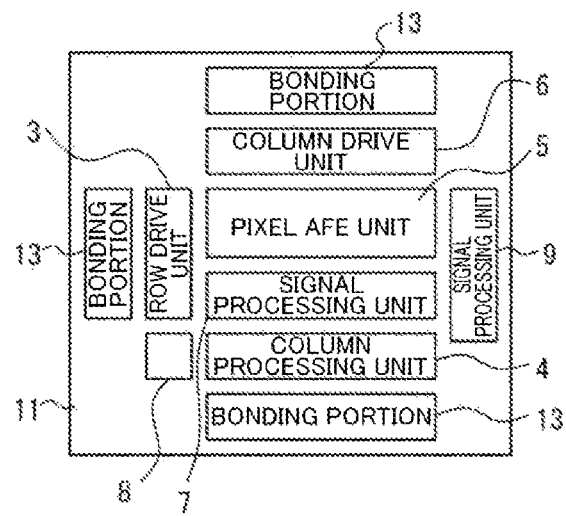
FIG. 3B is a diagram illustrating a second layout example of the other substrate to be stacked.

FIGS. 3A and 3B are diagrams illustrating a second layout example of the two substrates 11 and 12 to be stacked. Because the column processing unit 4 performs A/D conversion processing for each column, a plurality of comparators, counters, switches, memories, and the like are required. Therefore, a circuit scale of the column processing unit 4 increases when the number of columns is larger. Further, power supply voltages to be used may differ between the comparator and the counter in the column processing unit 4. Therefore, the column processing unit 4 is divided into two and partially disposed on the first substrate 11 and the second substrate 12. More specifically, in the column processing unit 4, a circuit portion using a high power supply voltage such as the comparator is disposed on the second substrate 12, and a circuit portion using a low power supply voltage such as the counter is disposed on the first substrate 11. This makes it possible to reduce types of respective power supply voltages supplied to the first substrate 11 and the second substrate 12.

Because the signal processing unit 7 receives signals from both the pixel AFE unit 5 and the column processing unit 4, the signal processing unit 7 is disposed between the pixel AFE unit 5 and the column processing unit 4 on the first substrate 11 in FIG. 3B.

Thus, in the second layout example of FIGS. 3A and 3B, because the column processing unit 4 is divided and disposed on the first substrate 11 and the second substrate 12 when the circuit scale of the column processing unit 4 is large or when the power supply voltage level used by the column processing unit 4 differs depending on the circuit inside the column processing unit 4, it is possible to curb variations in the circuit mounting areas of the first substrate 11 and the second substrate 12, and to divide a power supply voltage to be supplied, for each substrate. Further, the signal processing unit 7 is disposed between the pixel AFE unit 5 and the column processing unit 4, making it possible to increase a speed of transmission and reception of a signal between the signal processing unit 7 and the column processing unit 4, and transmission and reception of a signal between the signal processing unit 7 and the pixel AFE unit 5.

Figure 4A:
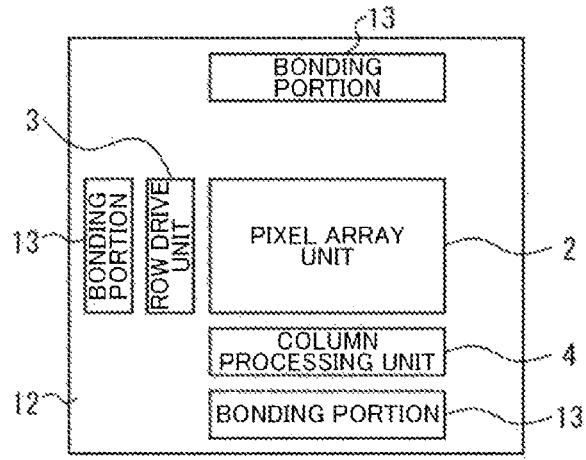
FIG. 4A is a diagram illustrating a third layout example of the one of the substrates to be stacked.
Figure 4B:
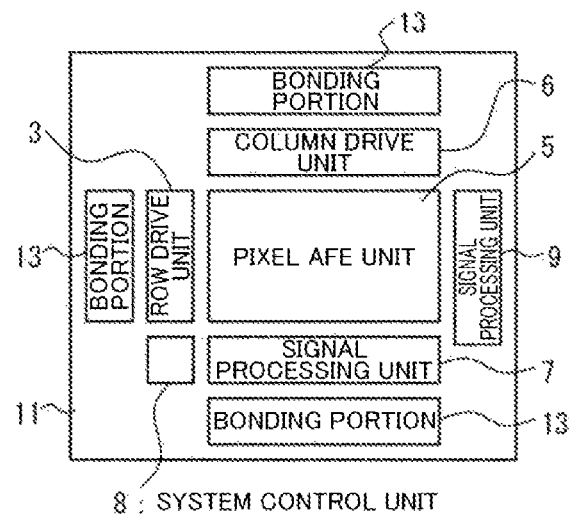
FIG. 4B is a diagram illustrating a third layout example of another substrate to be stacked.

FIGS. 4A and 4B are diagrams illustrating a third layout example of the two substrates 11 and 12 to be stacked. In the third layout example, a circuit portion (for example, a level shifter) driven by a high voltage, such as a level shifter, and a circuit portion driven by a low voltage among circuits constituting the row drive unit 3 are disposed on separate substrates.

The row drive units 3 are provided at vertically overlapping positions on the first substrate 11 and the second substrate 12 in FIG. 4A. The row drive unit 3 in the second substrate 12 includes the circuit portion driven by the high voltage, such as a level shifter, and the row drive unit 3 in the first substrate 11 includes the circuit portion driven by the low voltage, such as a shift register. The row drive units 3 of the respective substrates are bonded through Cu—Cu bonding, a TSV, microbump bonding, or the like.

Although the column processing unit 4 is disposed on the second substrate 12 in FIGS. 4A and 4B, the column processing unit 4 may be divided and disposed on the first substrate 11 and the second substrate 12, as in FIGS. 3A and 3B. Alternatively, the column processing unit 4 may be disposed on the first substrate 11 instead of the second substrate 12.

Figure 5A:
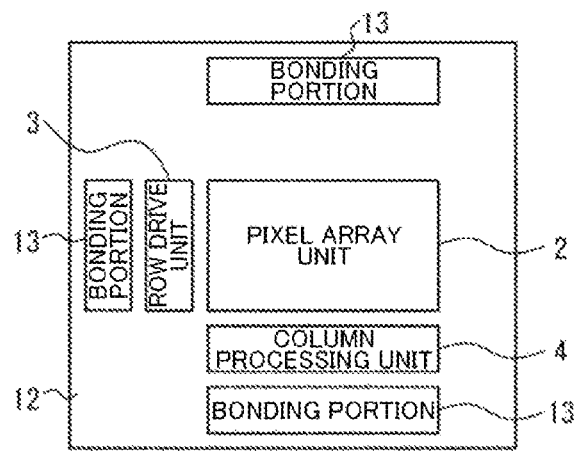
FIG. 5A is a diagram illustrating a fourth layout example of the one of the substrates to be stacked.
Figure 5B:
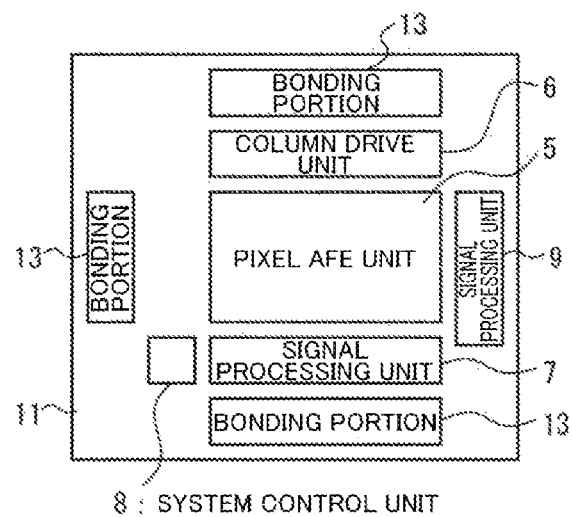
FIG. 5B is a diagram illustrating a fourth layout example of the other substrate to be stacked.

FIGS. 5A and 5B are diagrams illustrating a fourth layout example of the two substrates 11 and 12 to be stacked. In the fourth layout example, the row drive unit 3 and the column processing unit 4 are disposed on the second substrate 12. This makes it possible to further reduce a difference in the circuit mounting area between the first substrate 11 and the second substrate 12.

Figure 6:
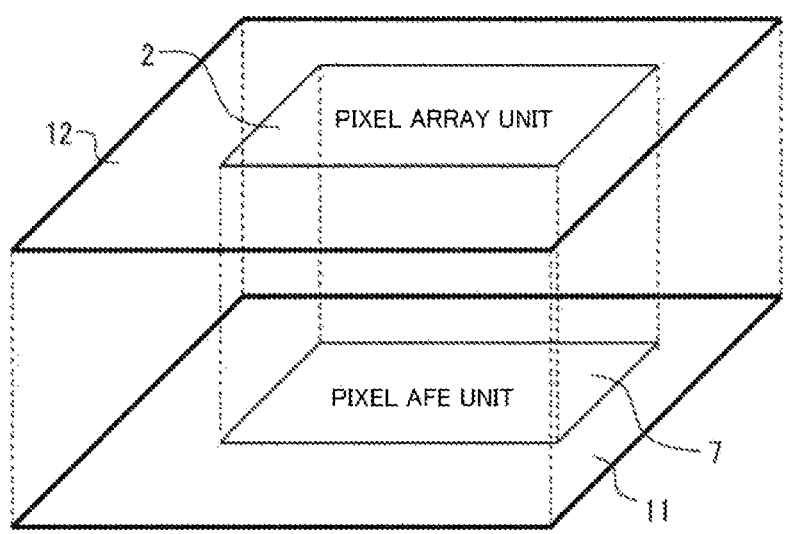
FIG. 6 is a diagram illustrating a positional relationship between a pixel array unit and a pixel AFE unit.

Various layout examples can be considered, in addition to the first to fourth layout examples described above. The first to fourth layouts described above are common in that the pixel array unit 2 on the second substrate 12 and the pixel AFE unit 5 on the first substrate 11 are disposed at vertically overlapping positions, as illustrated in FIG. 6. This makes it possible to efficiently perform reading from each pixel of the pixel array unit 2. The pixel array unit 2 and the pixel AFE unit 5 may partially vertically overlap each other, and it is not always necessary for the pixel array unit 2 and the pixel AFE unit 5 to entirely vertically overlap each other. Further, circuit mounting areas of the pixel array unit 2 and the pixel AFE unit 5 do not necessarily have to be the same.

Figure 7A:
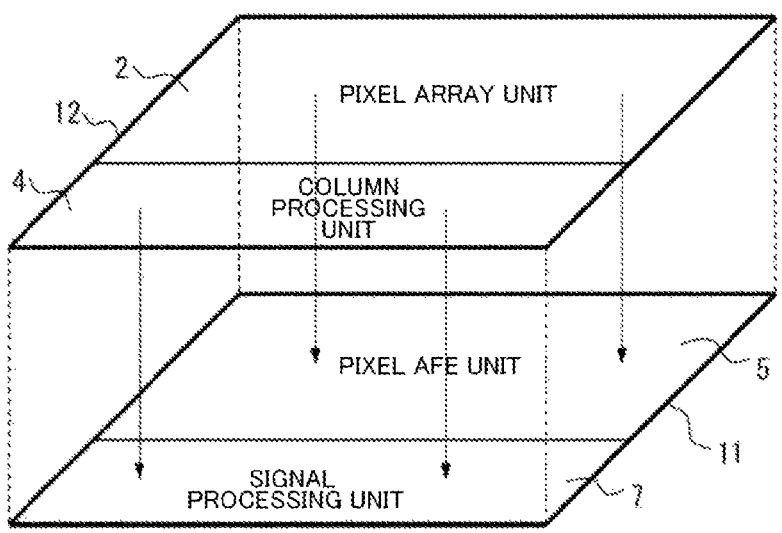
FIG. 7A is a schematic perspective view of a case in which a layout disposition of FIGS. 2A and 2B is adopted.

FIG. 7A is a schematic perspective view of the case in which the layout disposition of FIGS. 2A and 2B is adopted. In the case of FIGS. 2A and 2B, the column processing unit 4 is disposed on the second substrate 12, and the signal processing unit 7 is disposed on the first substrate 11. As illustrated in FIG. 7A, the column processing unit 4 and the signal processing unit 7 are disposed at vertically overlapping positions. Therefore, digital pixel data obtained through A/D conversion in the column processing unit 4 can be transmitted to the signal processing unit 7 in the second substrate 12 at the shortest distance via Cu—Cu bonding or the like, making it possible to rapidly perform signal processing without being influenced by parasitic capacitance or parasitic resistance of signal wirings. Further, in the layout disposition of FIG. 7A, because analog signals are mainly handled in the second substrate 12 and digital signals are mainly handled in the first substrate 11, the circuit on the first substrate 11 can be formed through a micro-fabrication process.

Figure 7B:
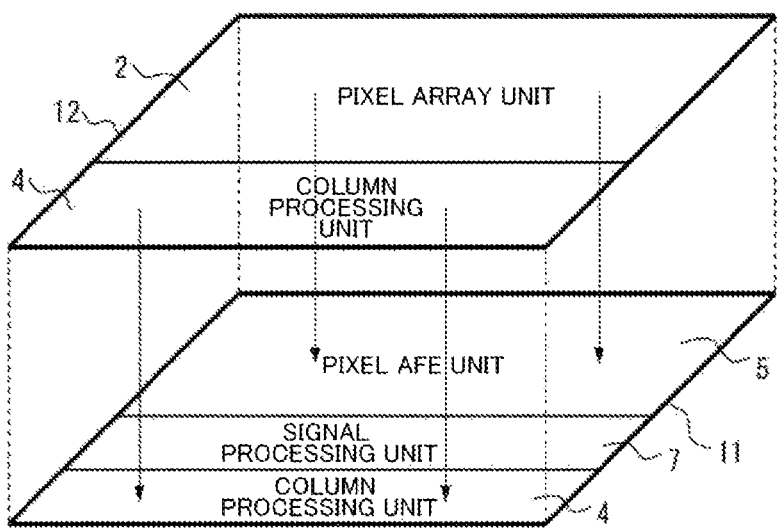
FIG. 7B is a schematic perspective view of a case in which a layout disposition of FIGS. 3A and 3B is adopted.

FIG. 7B is a schematic perspective view of the case in which the layout disposition of FIGS. 3A and 3B is adopted. In the case of FIGS. 3A and 3B, because the column processing unit 4 is disposed on both the first substrate 11 and the second substrate 12, for example, processing of a first half portion using a high power supply voltage of the column processing unit 4 can be performed in the column processing unit 4 in the second substrate 12, and processing of a latter half portion using a low power supply voltage can be performed in the column processing unit 4 in the first substrate 11. Because the column processing unit 4 of the first substrate 11 and the column processing unit 4 of the second substrate 12 are disposed at vertically overlapping positions as illustrated in FIG. 7B, it is possible to rapidly perform signal transmission and reception between the column processing units 4 on both substrates.

In the first to fourth layout examples described above, the pixel array unit 2 is disposed in the substantially central portion of the second substrate 12, but a disposition place of the pixel array unit 2 is arbitrary. Further, the number or disposition places of bonding portions 13 are arbitrary.

Figure 8A:
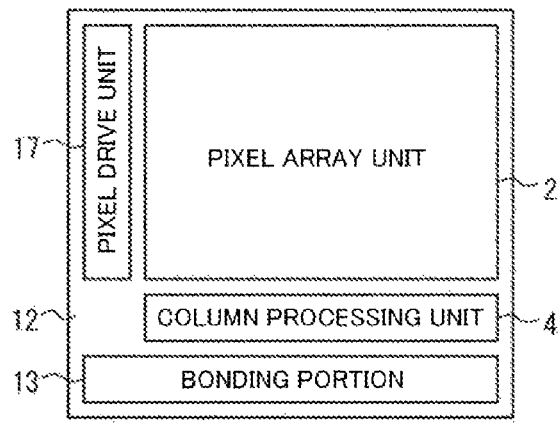
FIG. 8A is a layout diagram of a modification example of FIG. 2A.
Figure 8B:
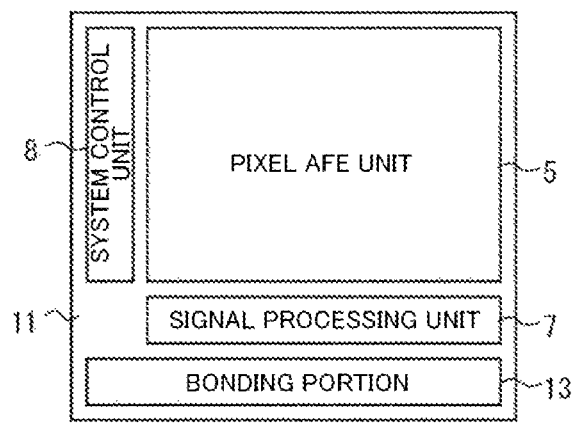
FIG. 8B is a layout diagram of a modification example of FIG. 2B.
Figure 8C:
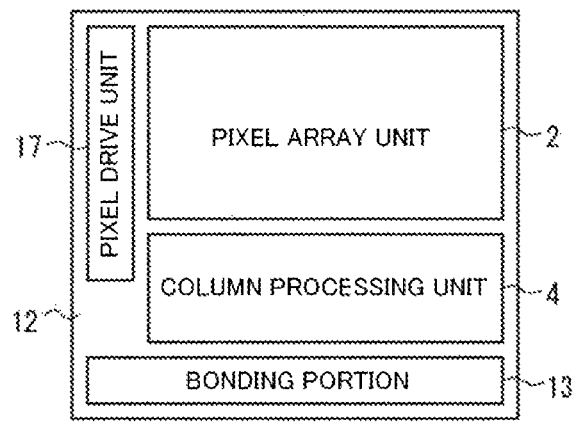
FIG. 8C is a layout diagram of a modification example of FIG. 3A.
Figure 8D:
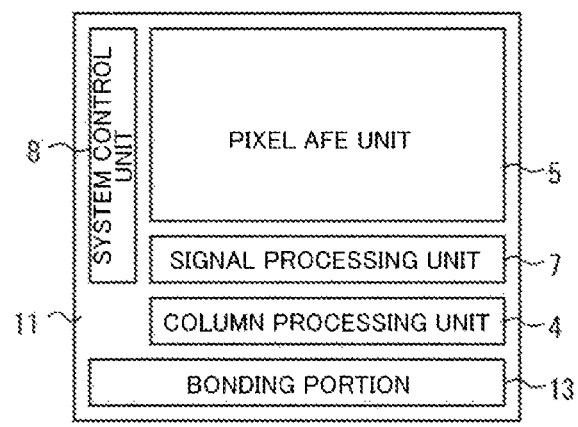
FIG. 8D is a layout diagram of a modification example of FIG. 3B.

FIGS. 8A and 8B are modification examples of FIGS. 2A and 2B. FIGS. 8C and 8D are modification examples of FIGS. 3A and 3B. In the second substrate 12 illustrated in FIGS. 8A and 8C, the pixel array unit 2 is disposed along one end side of the second substrate 12, and the bonding portion 13 is disposed along the other end side facing the one end side. In the first substrate 11 illustrated in FIGS. 8B and 8D, the pixel AFE unit 5 is disposed to vertically overlap the pixel array unit 2 of the second substrate 12, and the bonding portions 13 are also disposed to vertically overlap each other in the first substrate 11 and the second substrate 12.

As described above, various modification examples can be considered for a layout disposition of respective circuits in the first substrate 11 and the second substrate 12.

Figure 9A:
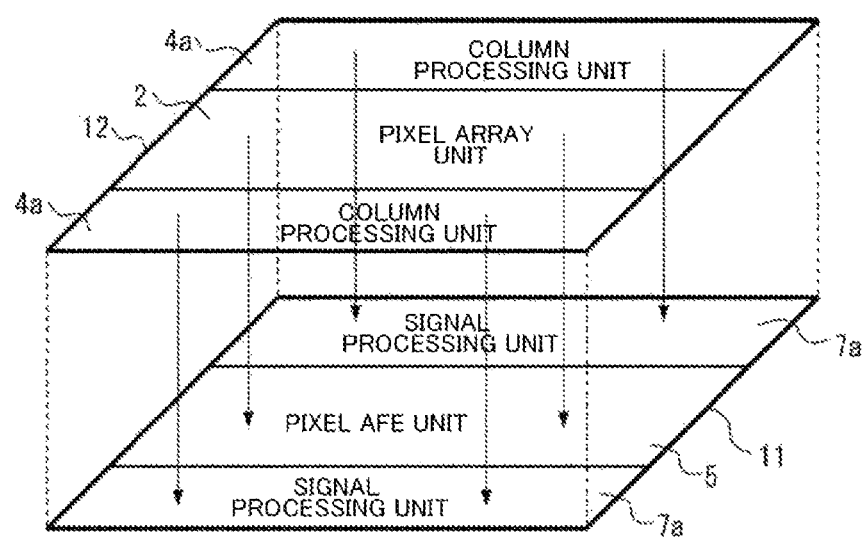
FIG. 9A is a perspective view illustrating a modification example of FIG. 7A.
Figure 9B:
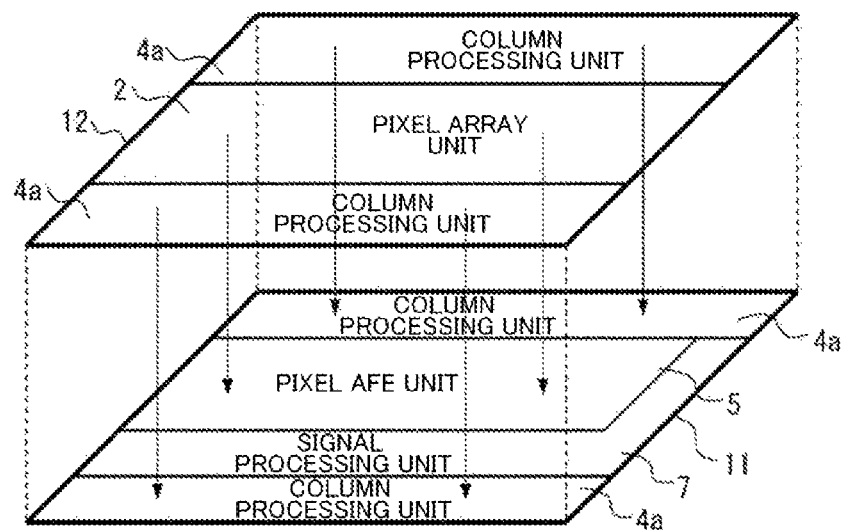
FIG. 9B is a perspective view illustrating a modification example of FIG. 7B.

FIG. 9A is a perspective view illustrating a modification example of FIG. 7A, and FIG. 9B is a perspective view illustrating a modification example of FIG. 7B. In FIG. 9A, the column processing unit 4 of the second substrate 12 is divided into two and disposed along two opposite end sides of the second substrate 12. Hereinafter, the two divided column processing units 4 are referred to as a divided column processing unit 4a. Accordingly, the signal processing unit 7 of the first substrate 11 is also divided into two and disposed along two opposite end sides of the first substrate 11. Hereinafter, the two divided signal processing units 7 are referred to as a divided signal processing unit 7a. The divided column processing unit 4a and the divided signal processing unit 7a on each end side are disposed to vertically overlap each other. The divided column processing unit 4a and the divided signal processing unit 7a are bonded through Cu—Cu bonding, TSV, microbump bonding, or the like and perform transmission and reception of various signals.

FIG. 9B is the same as FIG. 9A, and the two divided column processing units 4a are disposed along the two opposite end sides in any one of the first substrate 11 and the second substrate 12.

Thus, the column processing unit 4 is divided into two and disposed along the two opposite end sides of the second substrate 12, making it possible for a distance from the pixel array unit 2 to the column processing unit 4 to be as uniform as possible. Similarly, the signal processing unit 7 is divided into two and disposed along the two opposite end sides of the second substrate 12, making it possible for a distance from the pixel AFE unit 5 to the signal processing unit 7 to be as uniform as possible.

As illustrated in FIG. 6, in the present embodiment, the pixel array unit 2 and the pixel AFE unit 5 are disposed at vertically overlapping positions on the separate substrates, so that the pixel array unit 2 and the pixel AFE unit 5 rapidly perform transmission and reception of various signals. The pixel array unit 2 and the pixel AFE unit 5 transmit and receive various signals through Cu—Cu bonding, TSV, or microbump bonding.

Figure 10A:
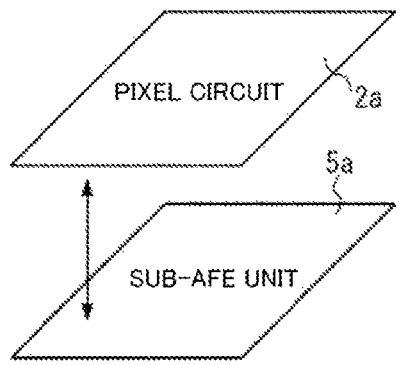
FIG. 10A is a diagram illustrating a connection aspect between each pixel circuit and each sub-AFE unit.
Figure 10B:
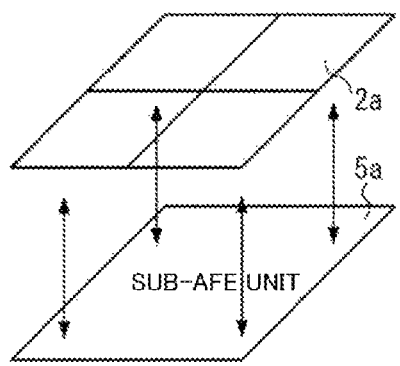
FIG. 10B is a diagram illustrating a connection aspect between each pixel circuit and each sub-AFE unit.
Figure 10C:
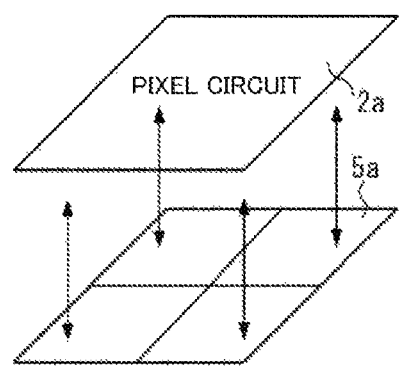
FIG. 10C is a diagram illustrating a connection aspect between each pixel circuit and each sub-AFE unit.
Figure 10D:
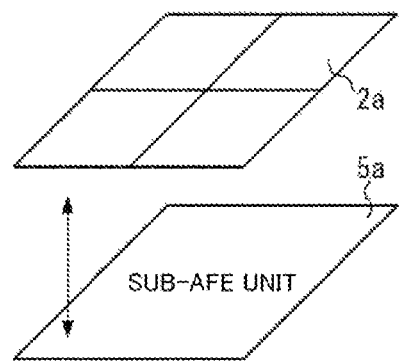
FIG. 10D is a diagram illustrating a connection aspect between each pixel circuit and each sub-AFE unit.

FIGS. 10A, 10B, 10C and 10D are diagrams illustrating a connection aspect between each pixel circuit 2a in the pixel array unit 2 and each sub-AFE unit 5a in the pixel AFE unit 5. In the connection aspect of FIG. 10A, an example in which each pixel circuit 2a in the pixel array unit 2 and one corresponding sub-AFE unit 5a in the pixel AFE unit 5 transmit and receive various signals is shown. FIG. 10B illustrates an example in which the plurality of pixel circuits 2a in the pixel array unit 2 and one corresponding sub-AFE unit 5a in the pixel AFE unit 5 transmit and receive various signals. FIG. 10C illustrates an example in which each pixel circuit 2a in the pixel array unit 2 and a plurality of corresponding sub-AFE units 5a in the pixel AFE unit 5 transmit and receive various signals. FIG. 10D illustrates an example in which only some of the pixel circuits 2a in the pixel array unit 2 and one corresponding sub-AFE unit 5a in the pixel AFE unit 5 transmit and receive various signals.

The connection aspect between the pixel array unit 2 and the pixel AFE unit 5 may be as illustrated in any one of FIGS. 10A to 10D. As illustrated in FIG. 10D, some of the pixel circuits 2a in the pixel array unit 2 may not perform transmission and reception of signals to and from the pixel AFE unit 5.

Figure 11:
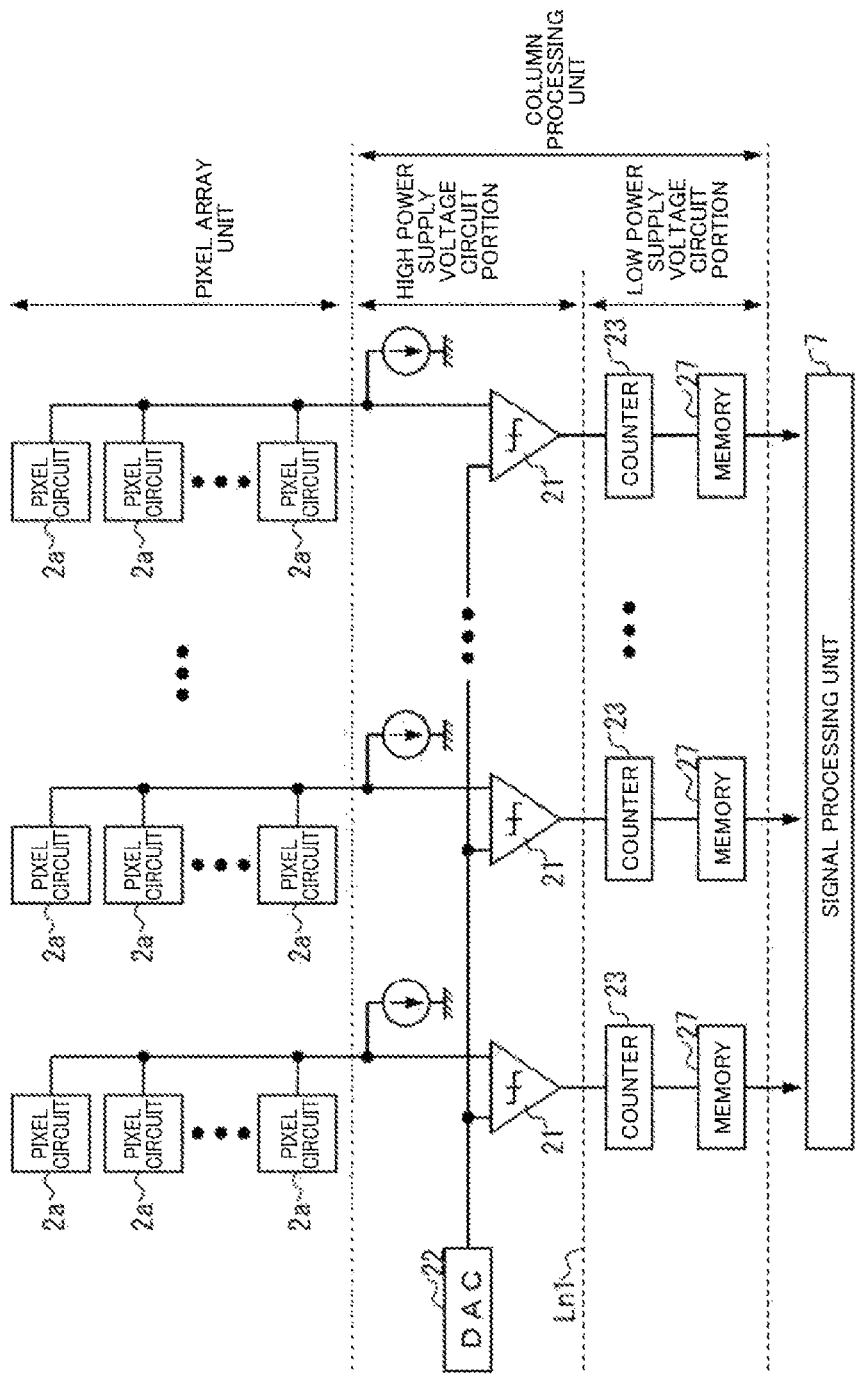
FIG. 11 is a block diagram illustrating an example of an internal configuration of a column processing unit.

FIG. 11 is a block diagram illustrating an example of an internal configuration of the column processing unit 4. As illustrated in FIG. 11, the column processing unit 4 includes a comparator 21, an up/down counter (hereinafter simply referred to as a counter) 23, and a memory 24 for each column signal line extending in the column direction. Further, the column processing unit 4 is provided with a DAC 22.

The DAC 22 generates a reference signal. The comparator 21 compares the voltage signal on the column signal line with the reference signal. The counter 23 counts a count value over a period until a comparison result from the comparator 21 is inverted. The count value of the counter 23 is held in the memory 24. A digital signal indicating the count value of the counter 23 held in the memory 24 is sent to the signal processing unit 7.

A high power supply voltage is supplied to a circuit portion (the comparator 21 and the like) on a broken line Ln1 in FIG. 11 in the column processing unit 4, whereas a low power supply voltage is supplied to a circuit portion (the counter 23, the memory 24, and the like) below the broken line Ln1. Therefore, in FIGS. 2A and 3A and the like described above, a high power supply voltage supply circuit portion (the comparator 21 and the like) that is a part of the column processing unit 4 is disposed on the second substrate 12.

Figure 12:
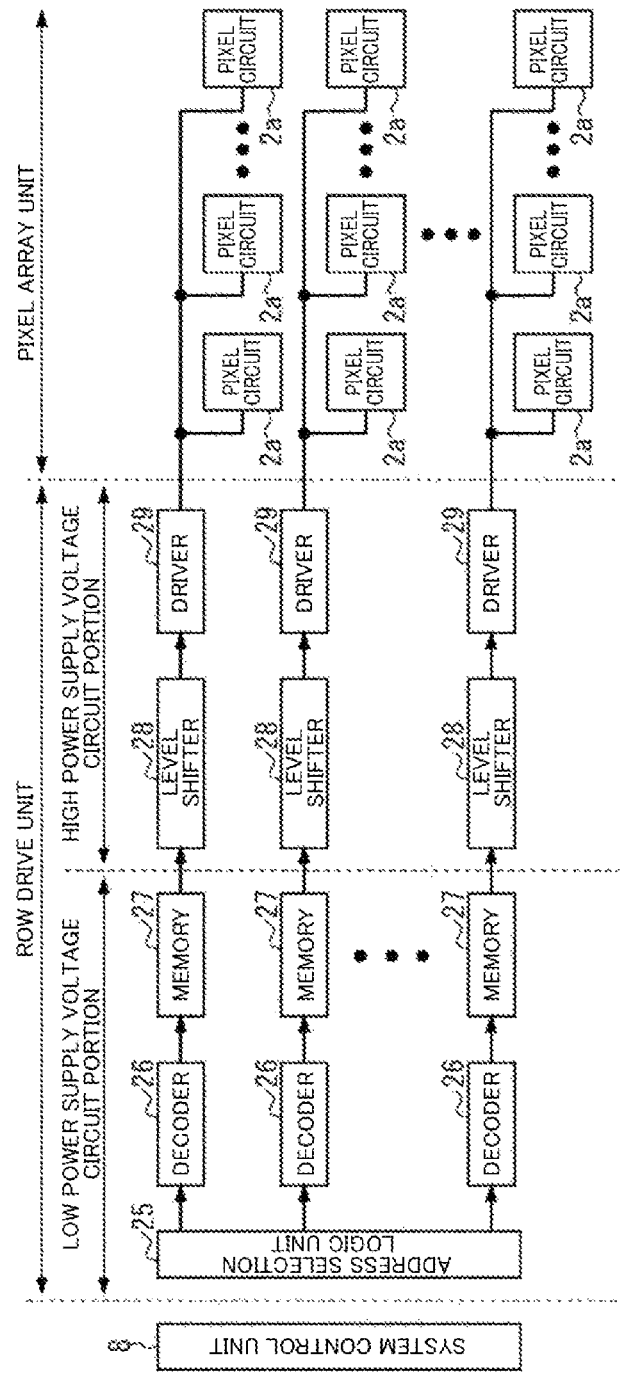
FIG. 12 is a block diagram illustrating an example of an internal configuration of a row drive unit.

FIG. 12 is a block diagram illustrating an example of an internal configuration of the row drive unit 3. As illustrated in FIG. 12, the row drive unit 3 includes an address selection logic unit 25, a plurality of decoders 26, a plurality of memories 27, a plurality of level shifters 28, and a plurality of drivers 29. Each driver 29 is connected to each row selection line of the pixel array unit 2.

The address selection logic unit 25 sends an address signal transmitted from the system control unit 8 to each decoder 26. The decoder 26 decodes the address signal. The signal decoded by the decoder 26 is temporarily stored in the memory 27. The level shifter 28 shifts a voltage level of the data stored in the memory 27 and supplies resultant data to the driver 29. The driver 29 drives a corresponding column selection line at a timing corresponding to the address signal. Signal transmission and reception may be performed between the plurality of drivers 29 and the plurality of memories 27.

A low power supply voltage is supplied to the address selection logic unit 25, the decoder 26, and the memory 27 in the row drive unit 3. Further, a high power supply voltage is supplied to the level shifter 28 and the driver 29. Therefore, in FIG. 4A and the like described above, a part of the column drive unit 6 is disposed on the second substrate 12.

As described above, the substrate in the present embodiment is a wafer or a chip. When the substrate is configured of chips, a plurality of chips may be disposed at the same layer height. More specifically, the first substrate 11 may be a wafer, the second substrate 12 may be a plurality of chips, and the plurality of chips may be stacked on the wafer by Chip on Wafer (CoW).

Figure 13A:
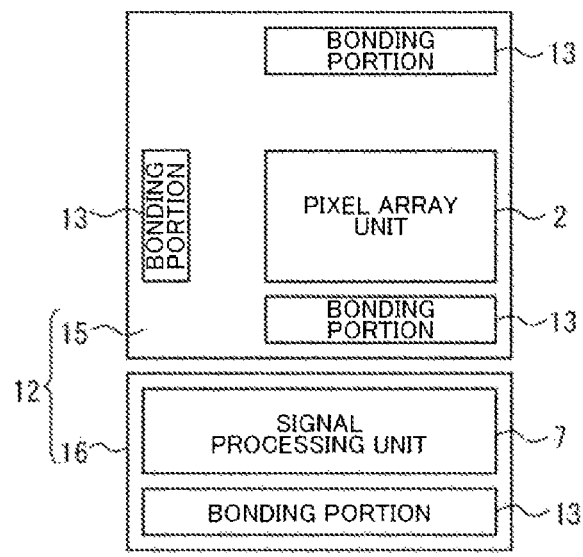
FIG. 13A is a layout diagram of a second substrate of a CoW scheme.
Figure 13B:
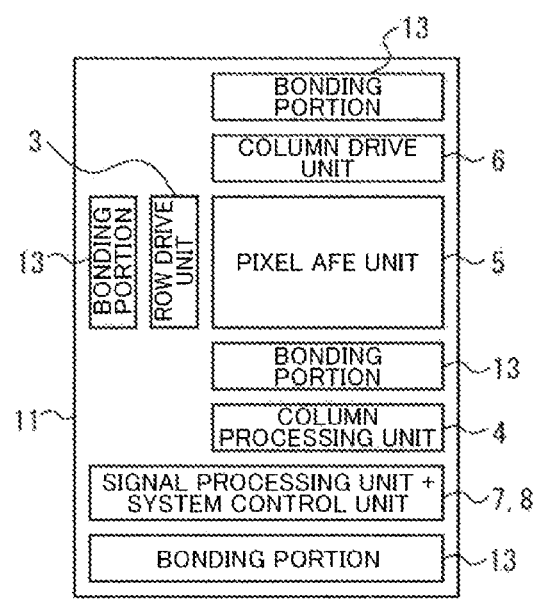
FIG. 13B is a layout diagram of a first substrate of a CoW scheme.

FIGS. 13A and 13B are layout diagrams illustrating an example of CoW. FIG. 13A illustrates a layout of the second substrate 12, and FIG. 13B illustrates a layout of the first substrate 11. The first substrate 11 is a wafer serving as a base. The pixel AFE unit 5, the row drive unit 3, the column drive unit 6, the column processing unit 4, the signal processing unit 7, and the system control unit 8 are disposed on the first substrate 11. The second substrate 12 is configured of two chips. The pixel array unit 2 is disposed on one chip (hereinafter, a first chip) 15 among the chips. The signal processing unit 7 is disposed on the other chip (hereinafter, a second chip) 16. The signal processing unit 7 on the second chip 16 is disposed at a position at which the signal processing unit 7 vertically overlaps the signal processing unit 7 of the first substrate 11. Similarly, the pixel array unit 2 on the first chip 15 is disposed at a position at which the pixel array unit 2 vertically overlaps the pixel AFE unit 5 of the first substrate 11. The pixel array unit 2 that handles analog signals is disposed on the first chip 15, whereas the signal processing unit 7 that handles digital signals is disposed on the second chip 16. Therefore, the signal processing unit 7 can be formed through a micro-fabrication process in the second chip 16, and even when a circuit scale of the signal processing unit 7 is large, the signal processing unit 7 can be mounted in the second chip 16 having a size smaller than that of the first chip 15. Further, it is also possible to make types of power supply voltages supplied to the first chip 15 and the second chip 16 different.

Figure 14A:
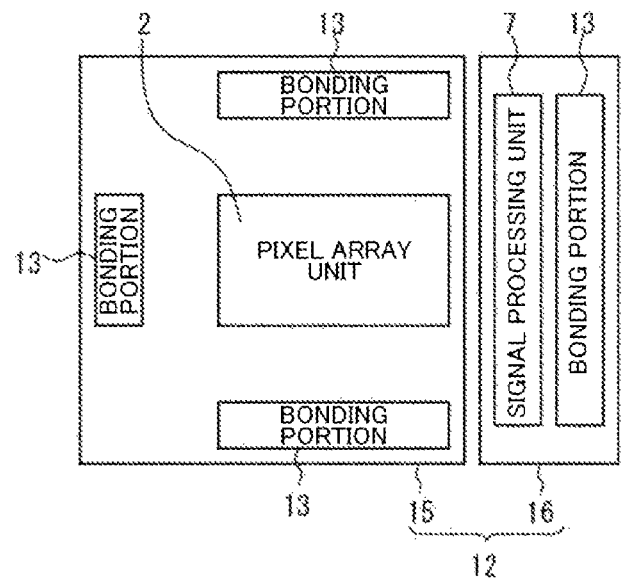
FIG. 14A is a layout diagram of the second substrate in which chips are disposed in a direction different from that of FIG. 13A.
Figure 14B:
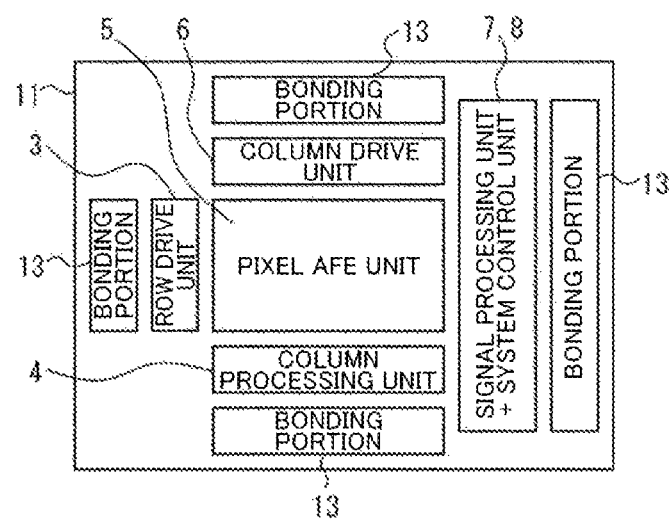
FIG. 14B is a layout diagram of the first substrate in which chips are disposed in a direction different from that of FIG. 13A.

Disposition places or sizes of the first chip 15 and the second chip 16 constituting the first substrate 11 are arbitrary. FIGS. 14A and 14B are layout diagrams illustrating an example in which the first chip 15 and the second chip 16 are disposed in different directions from those in FIGS. 13A and 13B. The layouts of the first substrate 11 and the second substrate 12 in FIGS. 14A and 14B are the same as those in FIGS. 13A and 13B.

Figure 15A:
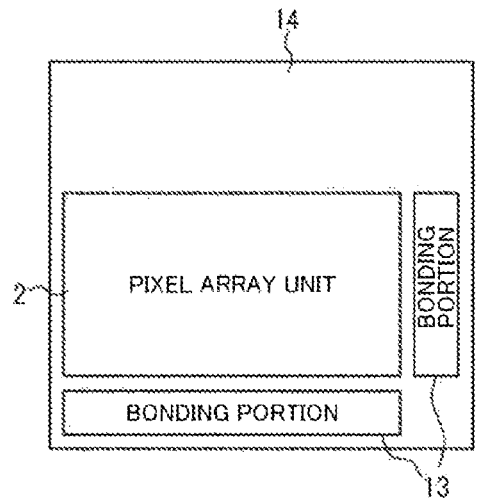
FIG. 15A is a first layout diagram of a third substrate having a three-layer structure.
Figure 15B:
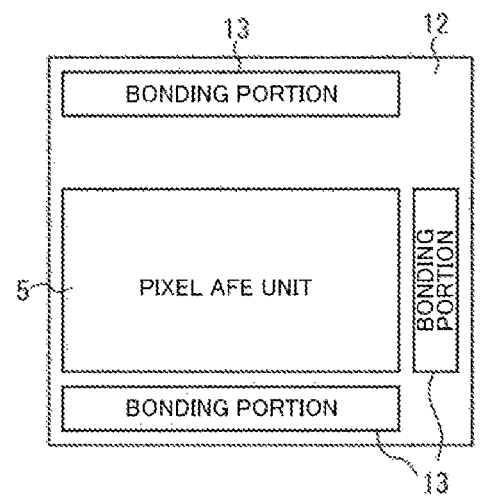
FIG. 15B is a first layout diagram of a second substrate having a three-layer structure.
Figure 15C:
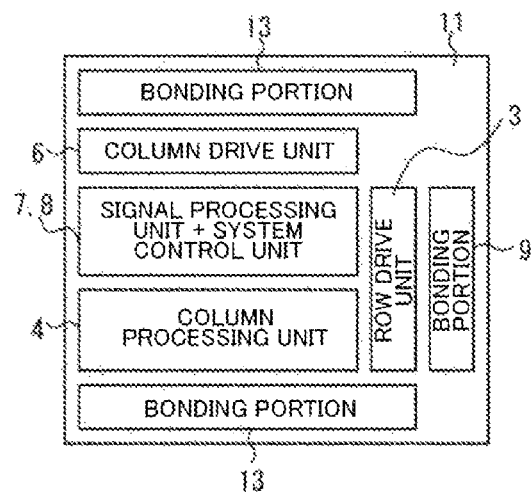
FIG. 15C is a first layout diagram of a first substrate having a three-layer structure.

Although the example in which the imaging device 1 is configured of the two stacked substrates 11 and 12 has been shown above, the imaging device 1 may be configured by stacking three or more substrates. FIGS. 15A, 15B and 15C are diagrams illustrating a first layout example of the imaging device 1 having a three-layer structure. FIG. 15A illustrates a layout disposition of the third substrate 14 on an uppermost layer, FIG. 15B illustrates a layout disposition of the second substrate 12 on a second stage, and FIG. 15C illustrates a layout disposition of the first substrate 11 on a lowermost layer.

The pixel array unit 2 is disposed on the third substrate 14. The pixel AFE unit 5 is disposed at a position at which the pixel AFE unit 5 vertically overlaps the pixel array unit 2 on the second substrate 12. The row drive unit 3, the column drive unit 6, the column processing unit 4, the signal processing unit 7, and the system control unit 8 are disposed on the first substrate 11. In the first layout example, the free region of the first substrate 11 is the largest, followed by the free region of the second substrate 12. Thus, there are variations in the free region in the first to third substrates 14.

Figure 16A:
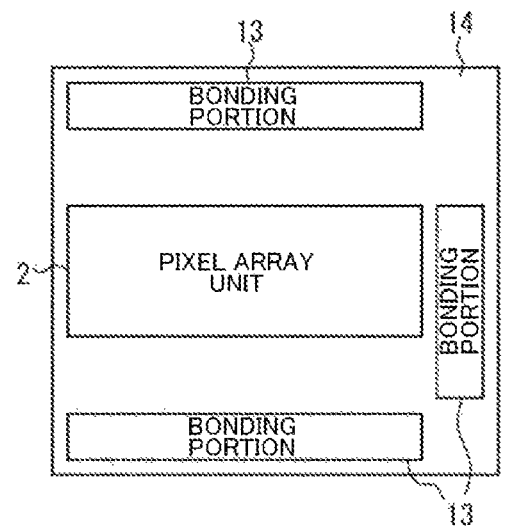
FIG. 16A is a second layout diagram of the third substrate having a three-layer structure.
Figure 16B:
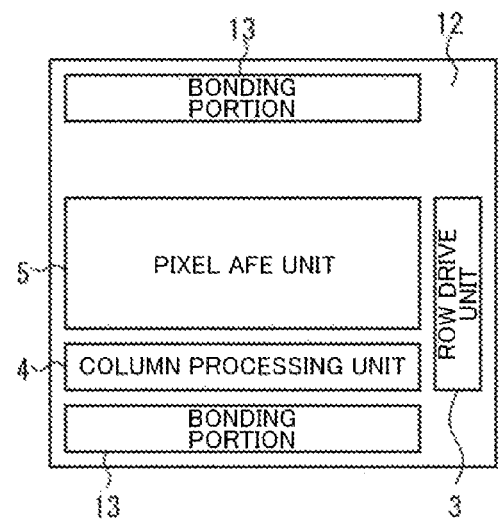
FIG. 16B is a second layout diagram of the second substrate having a three-layer structure.
Figure 16C:
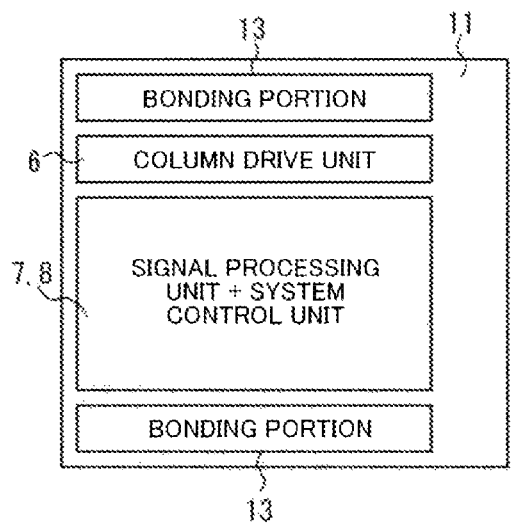
FIG. 16C is a second layout diagram of the first substrate having a three-layer structure.

FIGS. 16A, 16B and 16C are diagrams illustrating a second layout example of the imaging device 1 having a three-layer structure. In the second layout example, the row drive unit 3 and the column processing unit 4 disposed on the first substrate 11 in the first layout example are disposed on the second substrate 12, as illustrated in FIG. 16B. This makes it possible to curb variations in the free regions of the second substrate 12 and the third substrate 14. Further, because the column processing unit 4 and the column drive unit 6 use a high power supply voltage, circuit portions that use the high power supply voltage can be integrated on the second substrate 12, whereas only a logic circuit can be disposed on the first substrate 11 and the first substrate 11 can be formed through a micro-fabrication process, thereby achieving low power consumption.

Figure 17A:
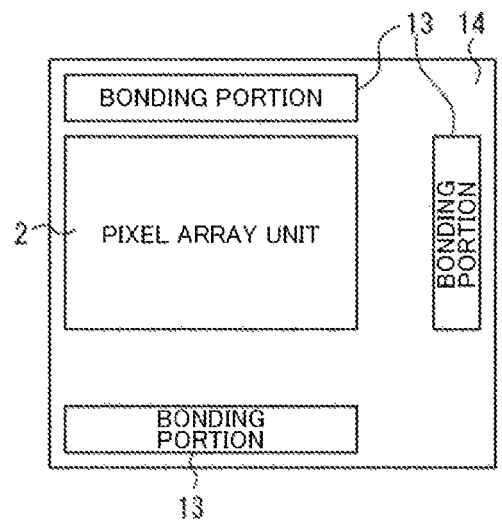
FIG. 17A is a third layout diagram of the third substrate having a three-layer structure.
Figure 17B:
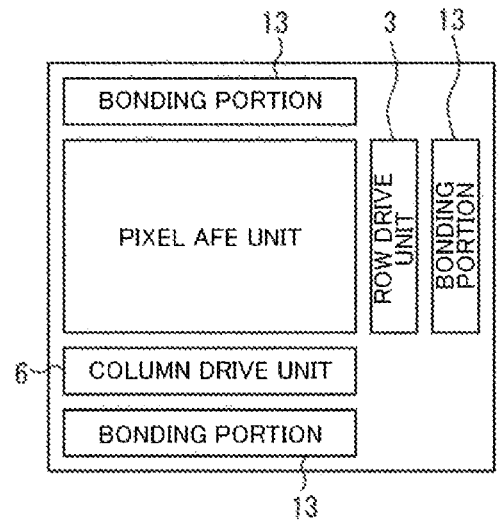
FIG. 17B is a third layout diagram of the second substrate having a three-layer structure.
Figure 17C:
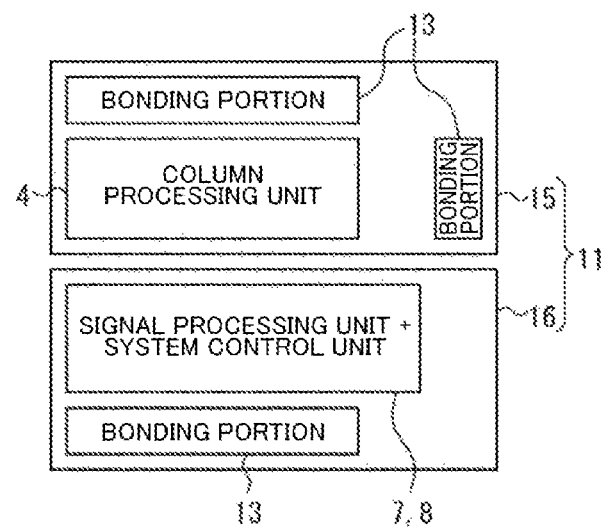
FIG. 17C is a third layout diagram of the first substrate having a three-layer structure.

FIGS. 17A, 17B, and 17C are diagrams illustrating a third layout example of the imaging device 1 having a three-layer structure. In the third layout example, the first substrate 11 is configured of the first chip 15 and the second chip 16. The column processing unit 4 is disposed on the first chip 15, and the signal processing unit 7 and the system control unit 8 are disposed on the second chip 16. In the third layout example, when there is no free region for disposing the column processing unit 4 and the row drive unit 3 that use a high power supply voltage on the second substrate 12, the first substrate 11 is divided into two chips, and the column processing unit 4 that uses a high power supply voltage can be disposed on the first chip 15, and only a logic circuit portion can be disposed on the second chip 16. This makes it possible to form the second chip 16 through a micro-fabrication process, and reduce power consumption.

In the above description, the example of the imaging device 1 having the column processing unit 4 has been given, but an imaging device 1 having no column processing unit 4 is also conceivable. The present embodiment is also applicable to such an imaging device 1.

Figure 18:
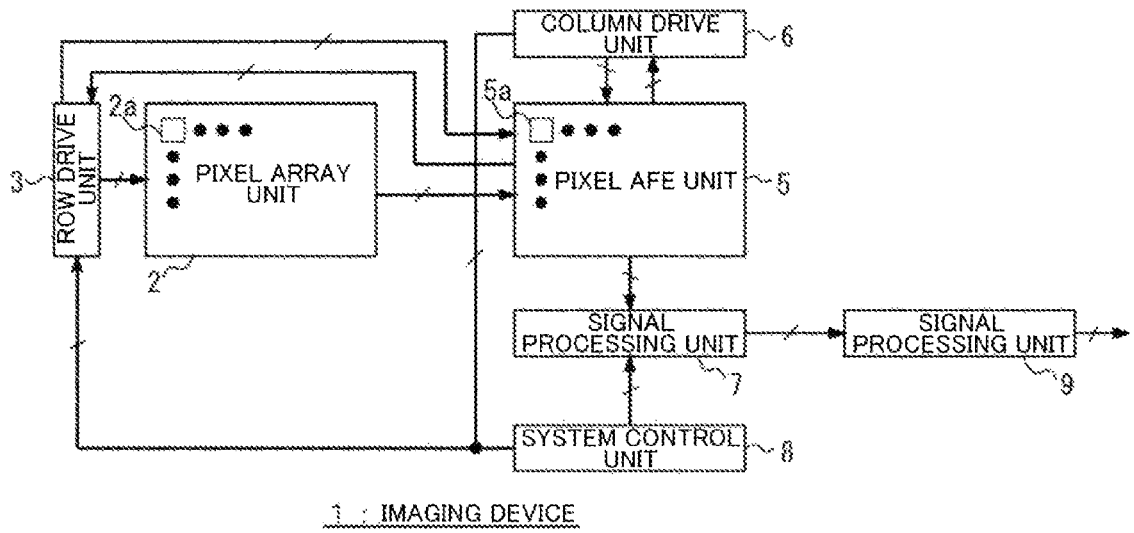
FIG. 18 is a block diagram illustrating a schematic configuration of an imaging device having no column processing unit.

FIG. 18 is a block diagram illustrating a schematic configuration of the imaging device 1 having no column processing unit 4. The imaging device 1 of FIG. 18 has a configuration in which the column processing unit 4 is omitted from FIG. 1. The pixel array unit 2 of FIG. 18 is driven row by row by the row drive unit 3. The electrical signals photoelectrically converted by the plurality of pixel circuits 2a connected to the respective rows are sequentially sent to the pixel AFE unit 5. Further, when an address event detection circuit to be described below is provided in the pixel circuit 2a, an event detection signal detected by the address event detection unit is also sent to the pixel AFE unit 5.

The pixel array unit 2 is used not only for the purpose of imaging, but also for the purpose of address event detection, the purpose of detecting a light reception position and a light reception timing of optical signal, or the purpose of A/D conversion for each pixel.

Figure 19A:
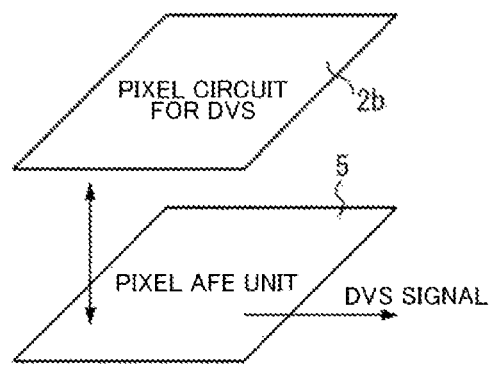
FIG. 19A is a diagram schematically illustrating generation of an address event detection signal.

FIG. 19A is a diagram schematically illustrating generation of an address event detection signal (hereinafter referred to as a DVS: Dynamic Vision Sensor signal) when the pixel array unit 2 is used for address event detection. When an address event is detected in the pixel circuit 2b for address event detection in the pixel array unit 2 (hereinafter referred to as a pixel circuit 2b for DVS), a DVS signal is output from the pixel AFE unit 5.

Figure 19B:
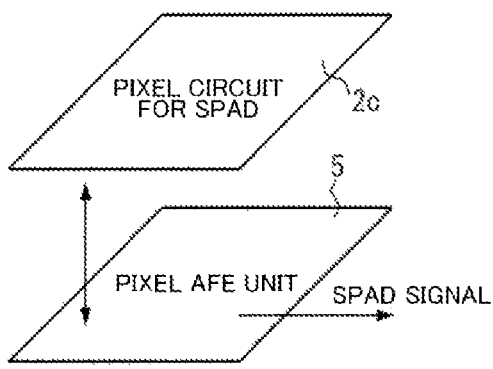
FIG. 19B is a diagram schematically illustrating generation of a SPAD signal.

FIG. 19B is a diagram schematically illustrating generation of a single photon avalanche diode (SPAD) signal when the pixel array unit 2 is used for optical signal reception position and timing detection. When an optical signal is detected by the pixel circuit 2c for SPAD in the pixel array unit 2, a digitized SPAD signal is output from the pixel AFE unit 5. In the pixel AFE unit 5, A/D conversion processing is performed.

Figure 19C:
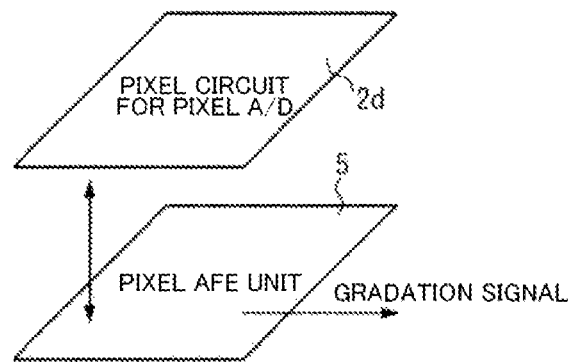
FIG. 19C is a diagram schematically illustrating generation of a gradation signal.

FIG. 19C is a diagram schematically illustrating generation of a gradation signal when the pixel array unit 2 is subjected to A/D conversion for each pixel. Pixels 2d for phase difference detection, for example, are provided in at least a part of the pixel array unit 2. The pixel 2d for phase difference detection has a configuration in which one pixel is divided into left and right, and performs photoelectric conversion for each divided pixel and detects a difference amount of an electrical signal obtained through photoelectric conversion in both the divided pixels. This difference amount corresponds to a defocus amount and can be used for automatic focus adjustment or the like. The difference amount or gradation signal described above is A/D converted and output by the pixel AFE unit 5.

Figure 20A:
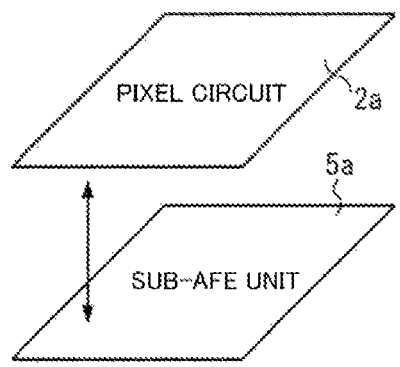
FIG. 20A is a diagram illustrating an example in which one pixel circuit corresponds to one sub-AFE unit.
Figure 20B:
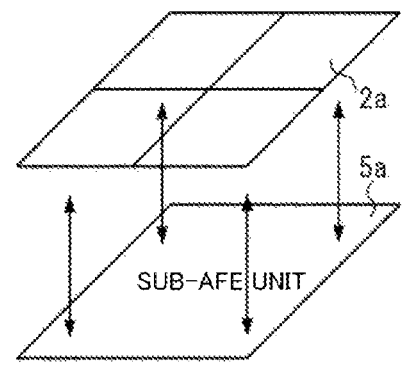
FIG. 20B is a diagram illustrating an example in which a plurality of pixel circuits correspond to one sub-AFE unit.
Figure 20C:
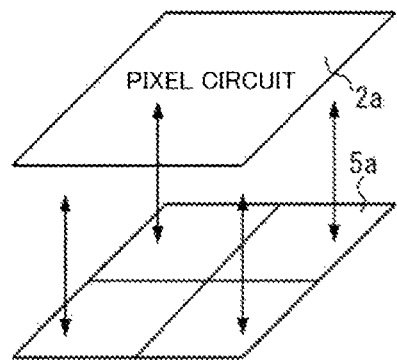
FIG. 20C is a diagram illustrating an example in which one pixel circuit corresponds to a plurality of sub-AFE units.

There are a plurality of correspondence relationships between each pixel circuit 2a in the pixel array unit 2 and each sub-AFE unit 5a in the pixel AFE unit 5 when the column processing unit 4 is not included. FIG. 20A illustrates an example in which one pixel circuit 2a in the pixel array unit 2 corresponds to one sub-AFE unit 5a in the pixel AFE unit 5. FIG. 20B illustrates an example in which the plurality of pixel circuits 2a in the pixel array unit 2 correspond to one sub-AFE unit 5a in the pixel AFE unit 5. FIG. 20C illustrates an example in which one pixel circuit 2a in the pixel array unit 2 corresponds to the plurality of sub-AFE units 5a in the pixel AFE unit 5.

Figure 21A:
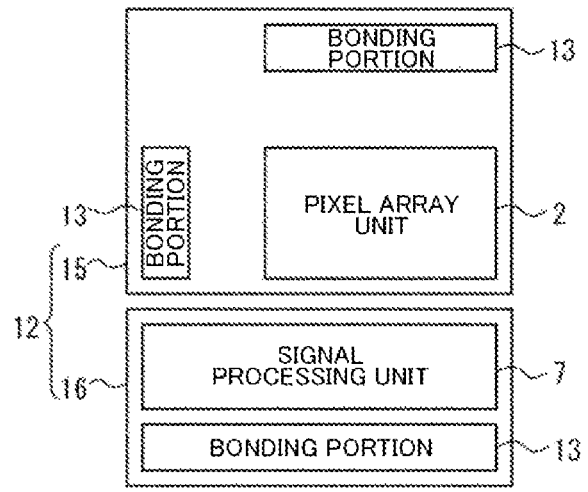
FIG. 21A is a first layout diagram of the second substrate when the column processing unit is not included.
Figure 21B:
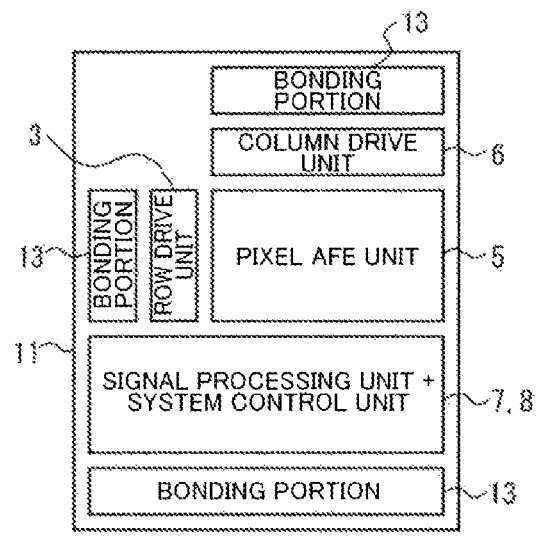
FIG. 21B is a first layout diagram of the first substrate when the column processing unit is not included.

FIGS. 21A and 21B are diagrams illustrating a first layout example of the imaging device 1 having no column processing unit 4. FIG. 21A illustrates the layout disposition of the second substrate 12, and FIG. 21B illustrates the layout disposition of the first substrate 11. The pixel AFE unit 5, the row drive unit 3, the column drive unit 6, the signal processing unit 7, and the system control unit 8 are disposed on the first substrate 11. The second substrate 12 includes the first chip 15 and the second chip 16. The pixel array unit 2 is disposed on the first chip 15. The signal processing unit 7 is disposed on the second chip 16. The signal processing unit 7 in the second chip 16 is disposed at a position at which the signal processing unit 7 in the second chip 16 vertically overlaps the signal processing unit 7 on the first substrate 11. Because the second chip 16 can be formed through a micro-fabrication process, the size of the second chip 16 can be smaller than that of the first chip 15.

Figure 22A:
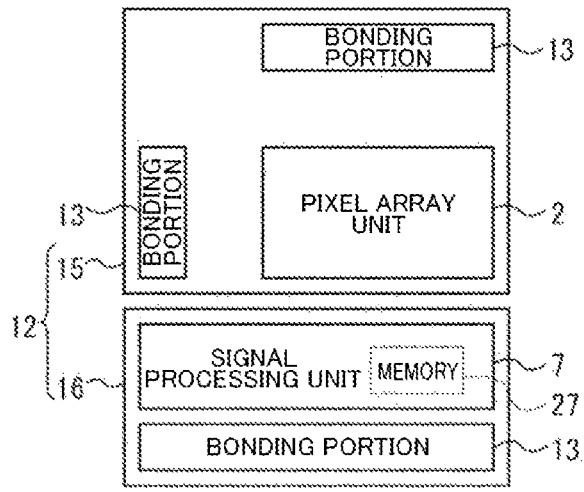
FIG. 22A is a second layout diagram of the second substrate when the column processing unit is not included.
Figure 22B:
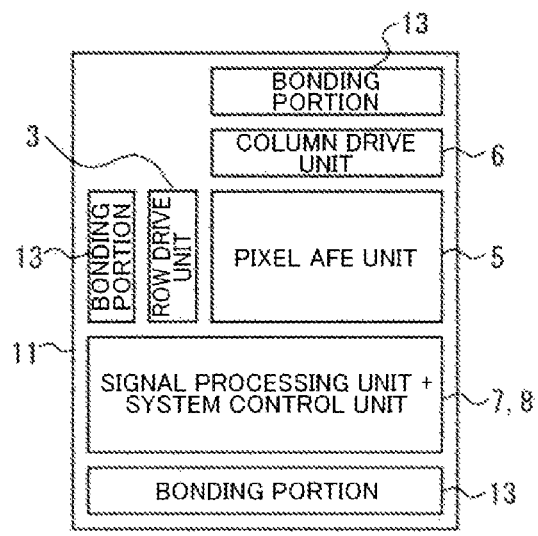
FIG. 22B is a second layout diagram of the first substrate when the column processing unit is not included.

FIGS. 22A and 22B are diagrams illustrating a second layout example of the imaging device 1 having no column processing unit 4. FIG. 22A differs from FIG. 21A in that the memory 27 is disposed in the signal processing unit 7 disposed in the second chip 16 in the second substrate 12 illustrated in FIG. 22A, and others also including the layout of the first substrate 11 are common with FIGS. 21A and 21B. A micro-fabrication process is used for the second chip 16, making it possible for a circuit requiring a large mounting area, such as the memory 27, to be realized with a relatively small chip.

In at least a part of the pixel array unit 2, the pixel circuit 2b for DVS can be provided, the pixel circuit 2c for SPAD can be provided, or the pixel circuit 2a for A/D conversion in units of pixels can be provided. That is, at least two of the pixel circuit 2a for imaging, the pixel circuit 2b for DVS, the pixel circuit 2c for SPAD, and a pixel circuit 2d for pixel A/D may be present in the pixel array unit 2. AN internal configuration of the pixel AFE unit 5 may change depending on a type of pixel circuit in the pixel array unit 2.

Figure 23A:
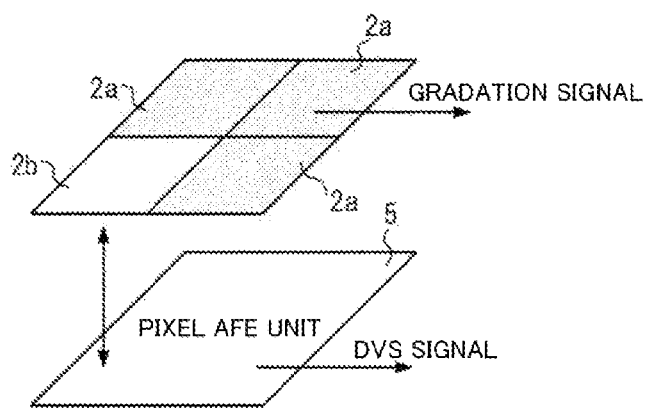
FIG. 23A is a diagram illustrating a first example of a pixel array unit.

FIG. 23A is a diagram illustrating a first example of the pixel array unit 2. The pixel array unit 2 of FIG. 23A shows an example in which the pixel circuit 2b for DVS is provided in a part of the pixel circuit 2a for imaging. In this case, when the address event is detected by the pixel circuit 2b for DVS, the address event detection signal (DVS signal) is output from the pixel AFE unit 5.

Figure 23B:
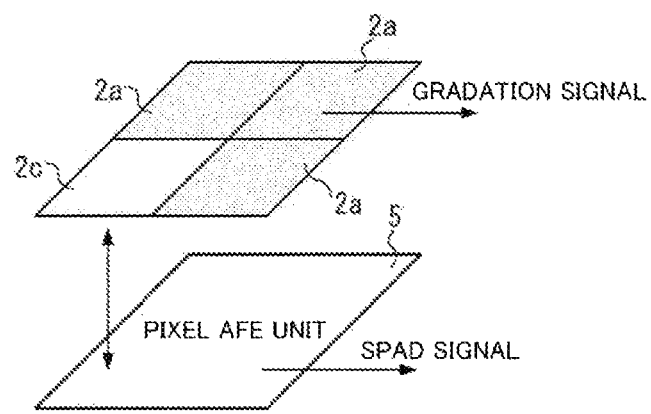
FIG. 23B is a diagram illustrating a second example of the pixel array unit.

FIG. 23B is a diagram illustrating a second example of the pixel array unit 2. The pixel array unit 2 of FIG. 23B shows an example in which the pixel circuit 2c for SPAD is provided in a part of the pixel circuit 2a for imaging. In this case, when the optical signal is detected by the pixel circuit 2c for SPAD, an SPAD signal indicating a detection place and a detection timing is output from the pixel AFE unit 5.

Figure 23C:
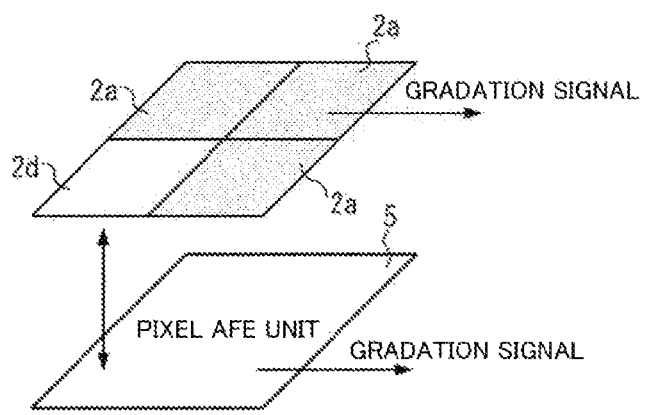
FIG. 23C is a diagram illustrating a third example of the pixel array unit.

FIG. 23C is a diagram illustrating a third example of the pixel array unit 2. The pixel array unit 2 of FIG. 23C shows an example in which the pixel circuit 2a for A/D conversion in units of pixels is provided in a part of the pixel circuit 2a for imaging. In this case, the electrical signal obtained through photoelectric conversion in the pixel circuit 2a for A/D conversion in units of pixels is sent to the pixel AFE unit 5, and digital pixel data obtained through A/D conversion is output.

When the pixel array unit 2 and the pixel AFE unit 5 detect an address event, the address event detection circuit is provided in at least one of the pixel array unit 2 and the pixel AFE unit 5.

Figure 24:
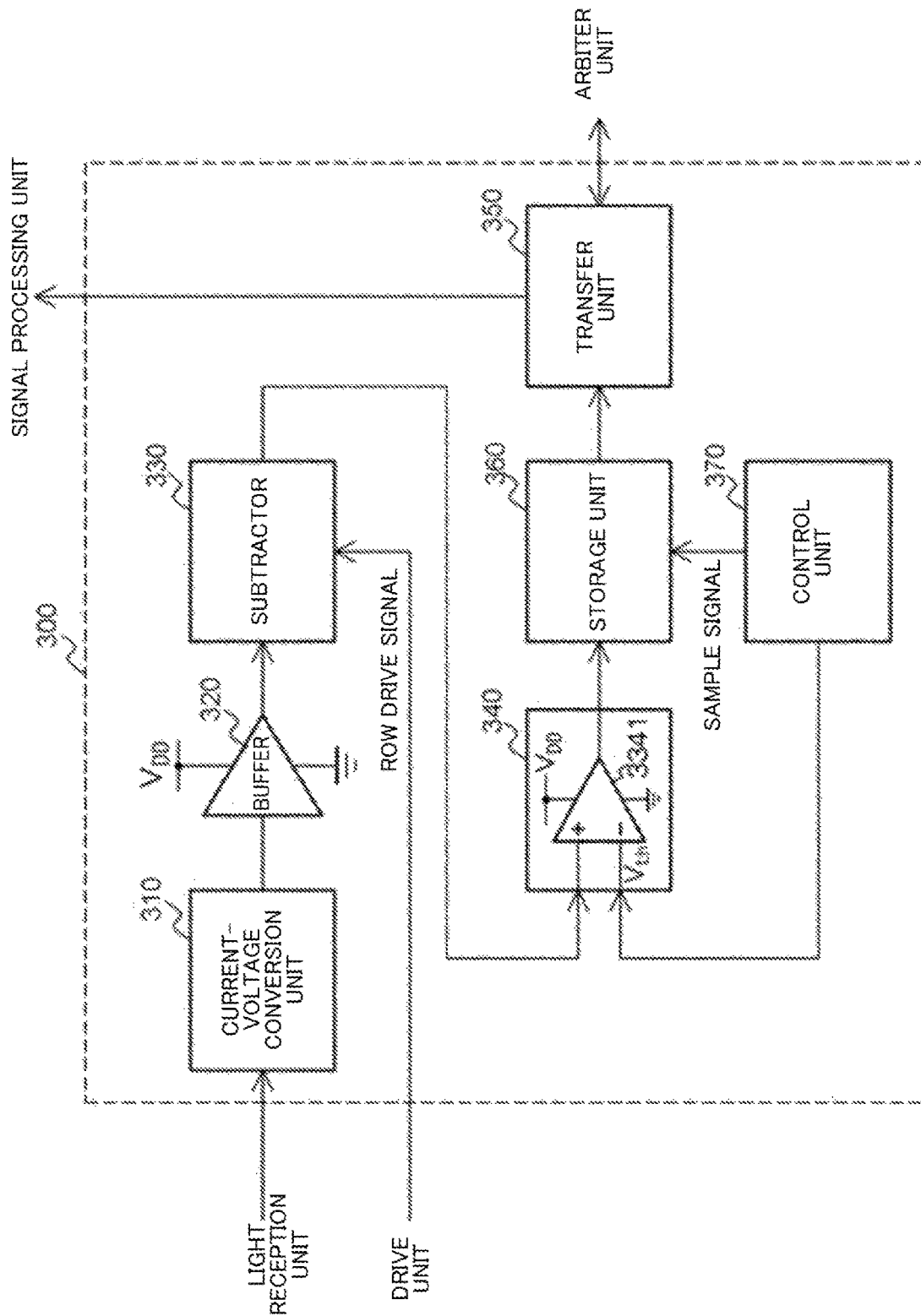
FIG. 24 is a block diagram illustrating an example of an address event detection circuit.

FIG. 24 is a block diagram illustrating an example of an address event detection circuit 300. The address event detection circuit 300 of FIG. 24 includes a current-voltage conversion circuit 310, a buffer 320, a subtractor 330, a quantizer 340, and a transfer circuit 350.

The current-voltage conversion circuit 310 converts a photocurrent from a corresponding photodiode 221 into a voltage signal. This current-voltage conversion circuit 310 supplies a voltage signal to the buffer 320.

The buffer 320 corrects the voltage signal from the current-voltage conversion circuit 310. This buffer 320 outputs the corrected voltage signal to the subtractor 330.

The subtractor 330 reduces a level of the voltage signal from the buffer 320 according to a row drive signal from the row drive circuit 251. This subtractor 330 supplies the reduced voltage signal to the quantizer 340.

The quantizer 340 quantizes the voltage signal from the subtractor 330 into a digital signal, and outputs the digital signal to the transfer circuit 350 as a detection signal.

The transfer circuit 350 transfers the detection signal from the quantizer 340 to the signal processing circuit 240 according to a column drive signal from the column drive circuit 252.

The current-voltage conversion circuit 310 and the buffer 320 of FIG. 24 are mounted on the pixel array unit 2, for example, and the subtractor 330, the quantizer 340, and the transfer circuit 350 are mounted on the pixel AFE unit 5.

Figure 25:
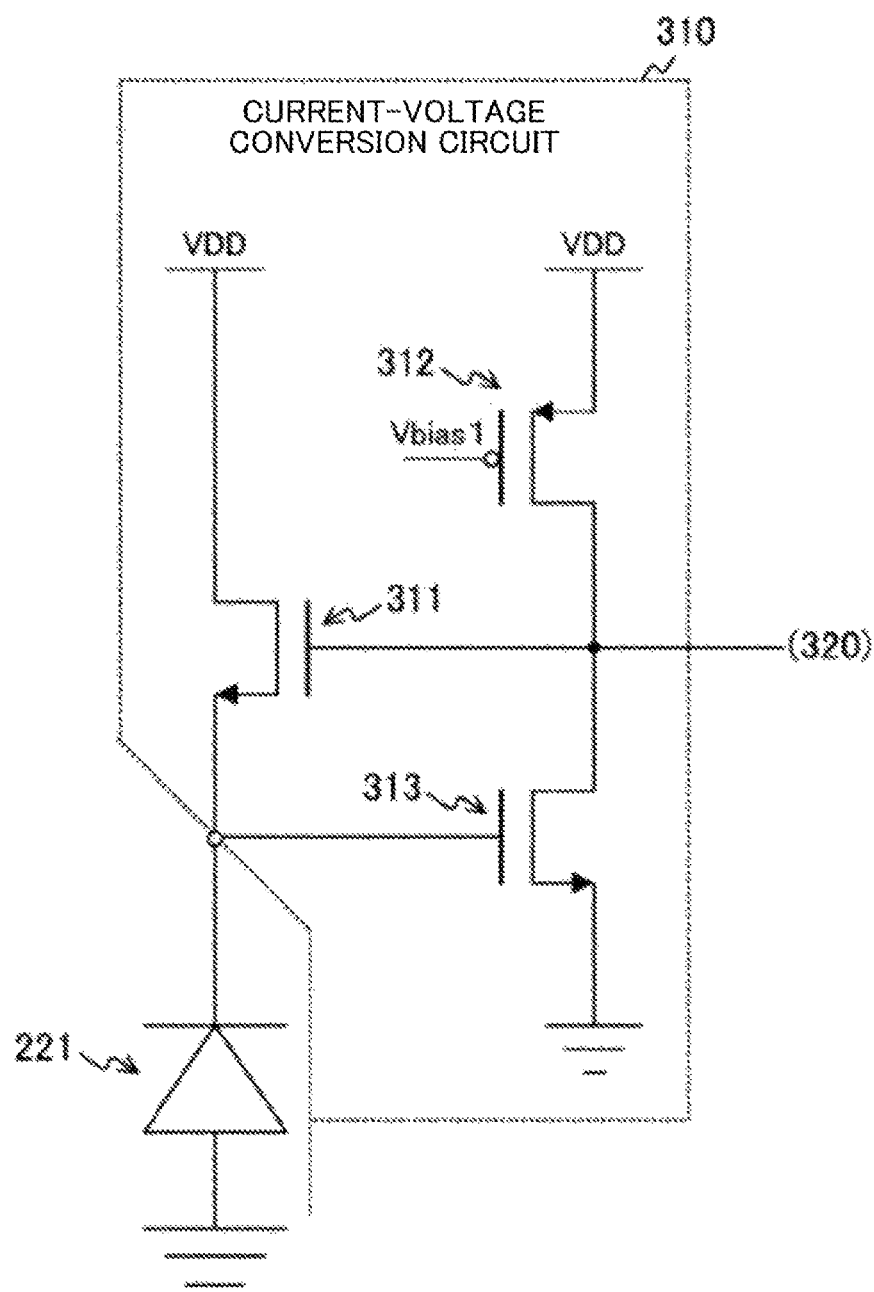
FIG. 25 is a circuit diagram illustrating an example of an internal configuration of a current-voltage conversion circuit.

FIG. 25 is a circuit diagram illustrating an example of an internal configuration of the current-voltage conversion circuit 310. The current-voltage conversion circuit 310 of FIG. 25 includes N-type transistors 311 and 313 and a P-type transistor 312. As these transistors, for example, metal-oxide-semiconductor (MOS) transistors are used.

A source of the N-type transistor 311 is connected to a cathode of the photodiode 221 and a drain thereof is connected to a power supply terminal. The P-type transistor 312 and the N-type transistor 313 are connected in series between the power supply terminal and a ground terminal. Further, a connection point of the P-type transistor 312 and the N-type transistor 313 is connected to a gate of the N-type transistor 311 and an input terminal of the buffer 320. Further, a predetermined bias voltage Vbias1 is applied to a gate of the P-type transistor 312.

The drains of the N-type transistors 311 and 313 are connected to the power supply side, and such a circuit is called a source follower. The photocurrent from the photodiode 221 is converted into a voltage signal by the two source followers connected in a loop form. Further, the P-type transistor 312 supplies a constant current to the N-type transistor 313.

Further, a ground of a light reception chip 201 and a ground of a detection chip 202 are separated from each other as a countermeasure against interference.

Figure 26:
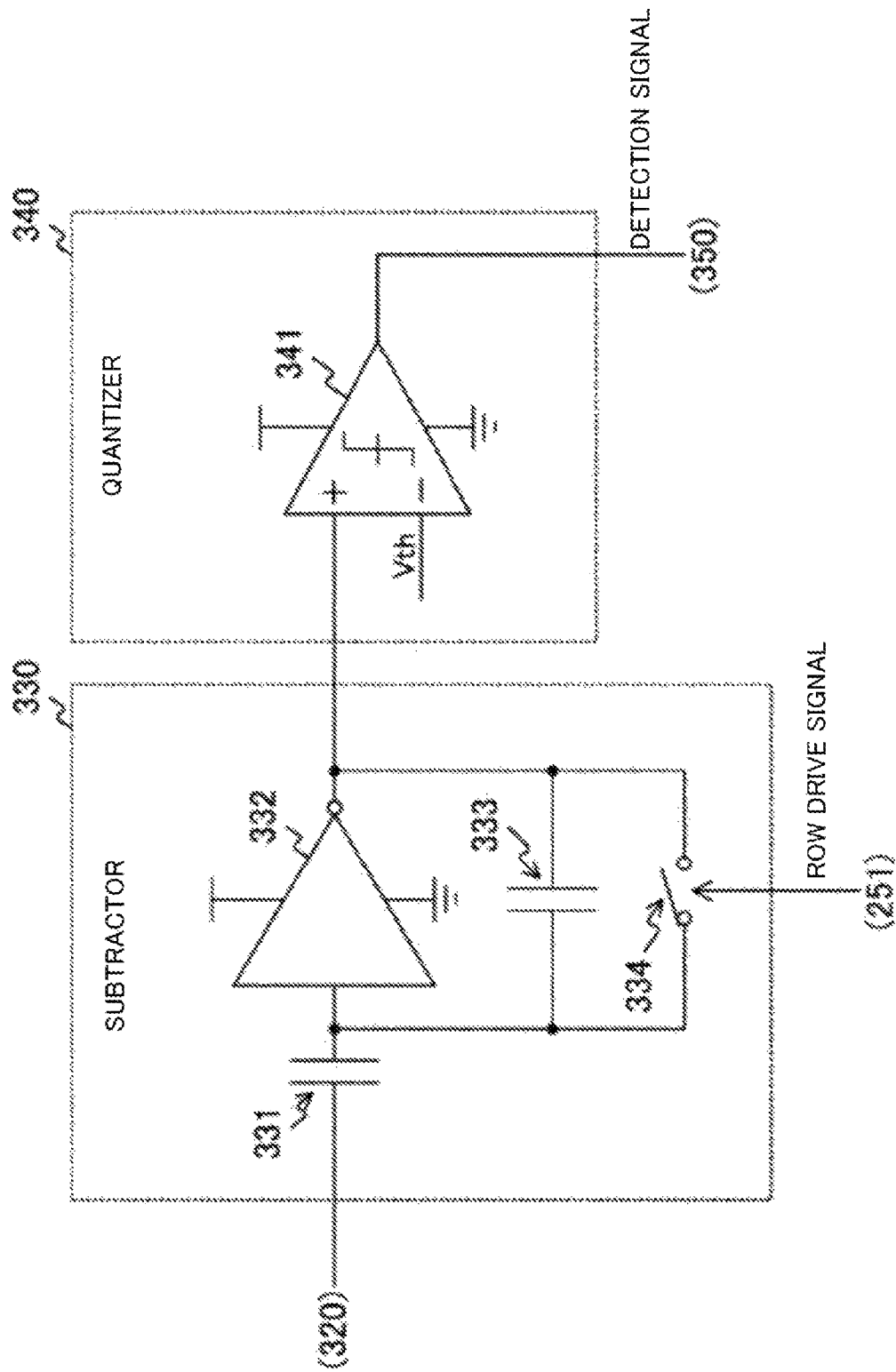
FIG. 26 is a circuit diagram illustrating an example of an internal configuration of a subtractor and a quantizer.

FIG. 26 is a circuit diagram illustrating an example of an internal configuration of the subtractor 330 and the quantizer 340. The subtractor 330 includes capacitors 331 and 333, a comparator 332, and a switch 334.

One terminal of the capacitor 331 is connected to an output terminal of the buffer 320, and the other terminal is connected to an input terminal of an inverter 332. A capacitor 333 is connected in parallel to the inverter 332. The switch 334 opens or closes a path connecting both terminals of the capacitor 333 according to the row drive signal.

The inverter 332 inverts a voltage signal input via the capacitor 331. The inverter 332 outputs an inverted signal to a non-inverting input terminal (+) of the comparator 332.

Incidentally, in an imaging device 1 of a rolling shutter type, because a photoelectric conversion result is transferred while scanning the pixel array unit 2 row by row, an image in which a fast moving object is distorted and visually recognized can be obtained. Therefore, an imaging device 1 of a global shutter type in which a photoelectric conversion result for one frame is stored in the memory 27 and the photoelectric conversion result is read out from the memory 27 and a captured image is generated is proposed.

Figure 27:
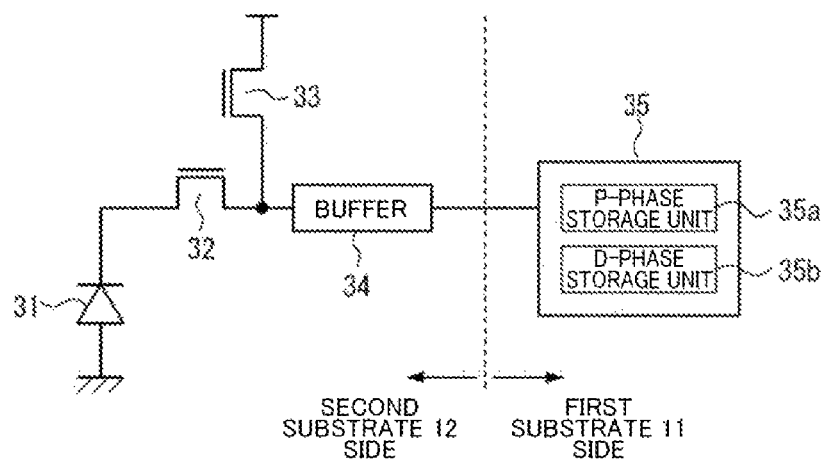
FIG. 27 is a circuit diagram of a pixel circuit in an imaging device of a global shutter type.

FIG. 27 is a circuit diagram of a pixel circuit 2a in the imaging device 1 of a global shutter type. The pixel circuit 2a of FIG. 27 includes a photoelectric conversion element 31, a transfer transistor 32, a reset transistor 33, a buffer 34, and a memory 35. The memory 35 includes a P-phase storage unit 35a and a D-phase storage unit 35b.

A potential at the time of resetting is stored in the P-phase storage unit 35a. A potential corresponding to the electrical signal obtained through photoelectric conversion is stored in the D-phase storage unit 35b. It is possible to offset a variation in the potential by detecting a difference between the potential stored in the P-phase storage unit 35a and the potential stored in the D-phase storage unit 35b. The potentials in the P-phase storage unit 35a and the D-phase storage unit 35b are re-stored each time imaging is performed.

In the present embodiment, a left side of a broken line in FIG. 27, that is, the photoelectric conversion element 31, the transfer transistor 32, and the reset transistor 33 are disposed in the pixel array unit 2 of the second substrate 12, and a right side of the broken line, that is, the memory 35 is disposed in the pixel AFE unit 5 in the first substrate 11.

Figure 28:
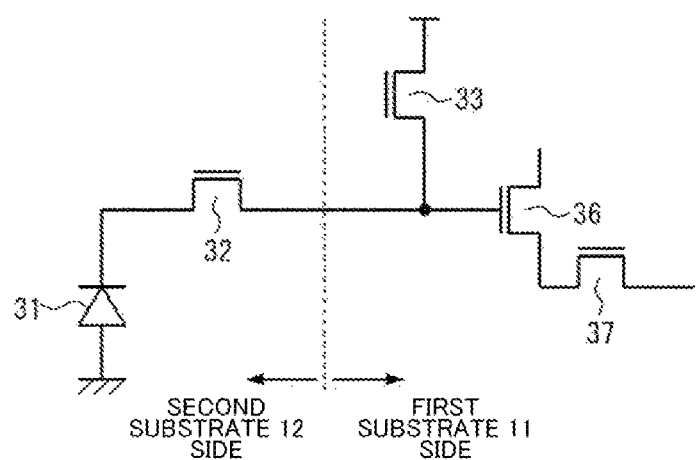
FIG. 28 is a circuit diagram of a pixel circuit in an imaging device of a rolling shutter type.

FIG. 28 is a circuit diagram of a pixel circuit 2a in the imaging device 1 of a rolling shutter type. The pixel circuit 2a of FIG. 28 includes a photoelectric conversion element 31, a transfer transistor 32, a reset transistor 33, an amplification transistor 36, and a selection transistor 37.

In the present embodiment, a left side of the broken line in FIG. 28, that is, the photoelectric conversion element 31 and the transfer transistor 32 are disposed in the pixel array unit 2 of the second substrate 12, and a right side of the broken line, that is, the reset transistor 33, the amplification transistor 36, and the selection transistor 37 are disposed in the pixel AFE unit 5 in the first substrate 11.

Figure 29:
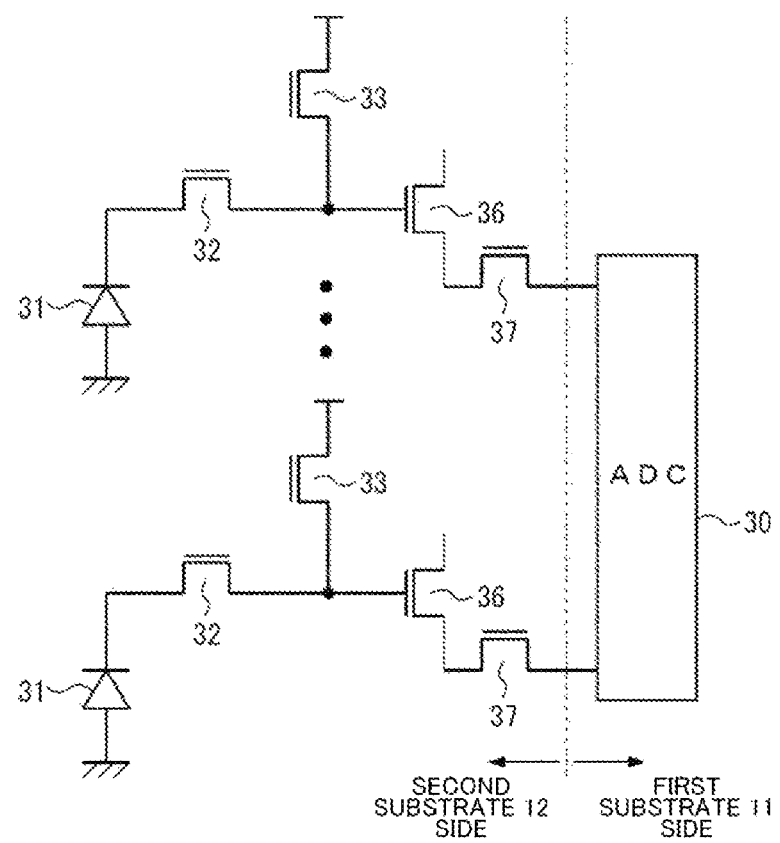
FIG. 29 is a circuit diagram of the surroundings of a pixel circuit of an area AD type that performs A/D conversion in units of pixel regions.

FIG. 29 is a circuit diagram of a surrounding of a pixel circuit 2a of an area AD type that performs A/D conversion in units of pixel regions. In the pixel circuit 2a of FIG. 29, the plurality of pixel circuits 2a are connected to one A/D converter (hereinafter referred to as an ADC). Each pixel circuit 2a includes a photoelectric conversion element 31, a transfer transistor 32, a reset transistor 33, an amplification transistor 36, and a selection transistor 37.

In the present embodiment, a left side of a broken line in FIG. 29 is disposed in the pixel array unit 2 of the second substrate 12, and the ADC on the right side of the broken line is disposed in the pixel AFE unit 5 in the first substrate 11.

Figure 30:
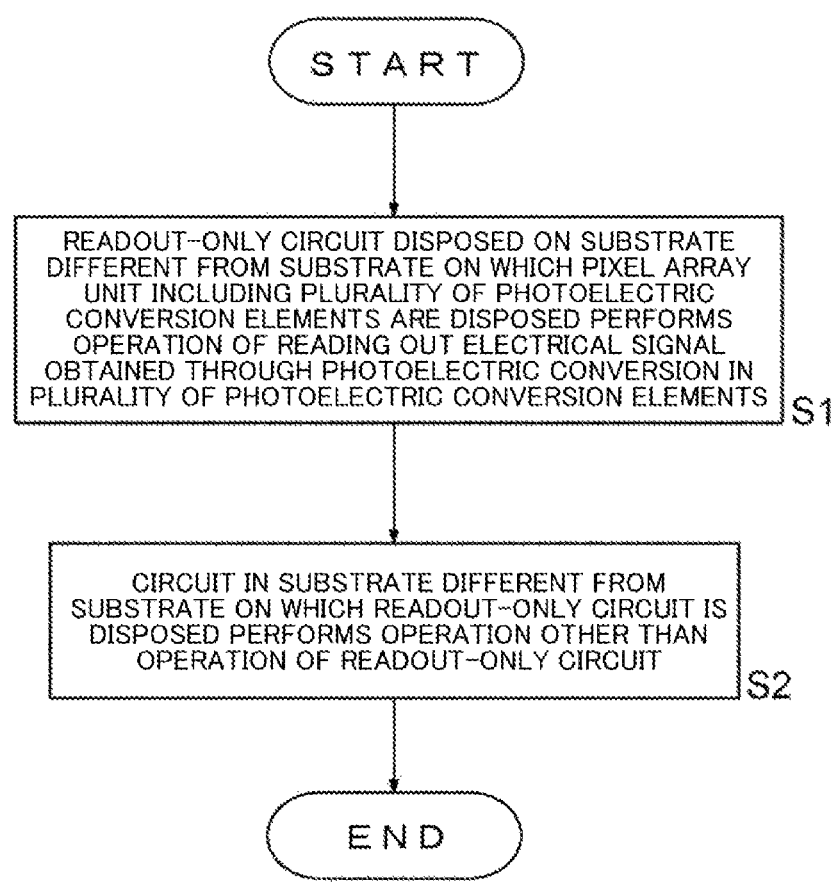
FIG. 30 is a flowchart illustrating a processing procedure that is performed by the imaging device 1 according to the first embodiment.

FIG. 30 is a flowchart illustrating a processing procedure that is performed by the imaging device 1 according to the first embodiment. First, the pixel AFE unit 5 (the readout-only circuit) disposed on a substrate different from the substrate on which the pixel array unit 2 including a plurality of photoelectric conversion elements 31 are disposed performs an operation of reading out the electrical signal obtained through photoelectric conversion in the plurality of photoelectric conversion elements 31 (step S1).

Then, an operation other than an operation of the pixel AFE unit 5 is performed in a circuit in a substrate different from the substrate on which the pixel AFE unit 5 is disposed (step S2).

Thus, in the present embodiment, the pixel array unit 2 and the pixel AFE unit 5 are disposed on separate substrates, and a circuit that performs an operation other than an operation of the pixel AFE unit 5 in the imaging device 1 is disposed on a substrate separate from the substrate on which the pixel AFE unit 5 is disposed. This makes it possible to curb a variation in the circuit mounting area on each substrate and to reduce a free region of each substrate, and power consumption is reduced.

For example, a substrate on which a circuit using a high power supply voltage is disposed and a substrate on which a circuit using a low power supply voltage is disposed are divided, making it possible to reduce types of power supply voltages to be supplied to the respective substrates, shorten a wiring pattern for supplying the power supply voltage, and reduce power supply noise. More specifically, for a circuit including a circuit portion using a high power supply voltage and a circuit portion using a low power supply voltage, such as the column processing unit 4, the row drive unit 3, and the column drive unit 6, the respective circuit portions are divided and disposed on a plurality of substrates, so that the substrate size or power consumption can be reduced.

When a plurality of circuit portions that perform signal transmission and reception are divided and disposed on a plurality of substrates, the respective circuit portions are disposed at vertically overlapping positions, and the respective circuit portions are bonded through Cu—Cu bonding, TSV, microbump bonding, or the like, and thus, the respective circuit portions are less susceptible to parasitic resistance or parasitic capacitance, and a signal propagation delay time can be shortened.

Further, a substrate on which a circuit including an analog circuit is disposed and a substrate on which a digital circuit is disposed are divided, making it possible to form a circuit on the substrate on which the digital circuit is disposed by using a state-of-the-art micro-fabrication process, to reduce the substrate size, and reduce the power consumption on the substrate.

The pixel array unit 2 can be used not only for the purpose of imaging, but also for the purpose of detecting an address event, the purpose of detecting a light reception position and a light reception timing of an optical signal, the purpose of A/D conversion in units of pixels, and the like, and it is possible to distribute the respective circuits constituting the imaging device 1 to a plurality of substrates according to each of the purposes.

Second Embodiment

Figure 31:
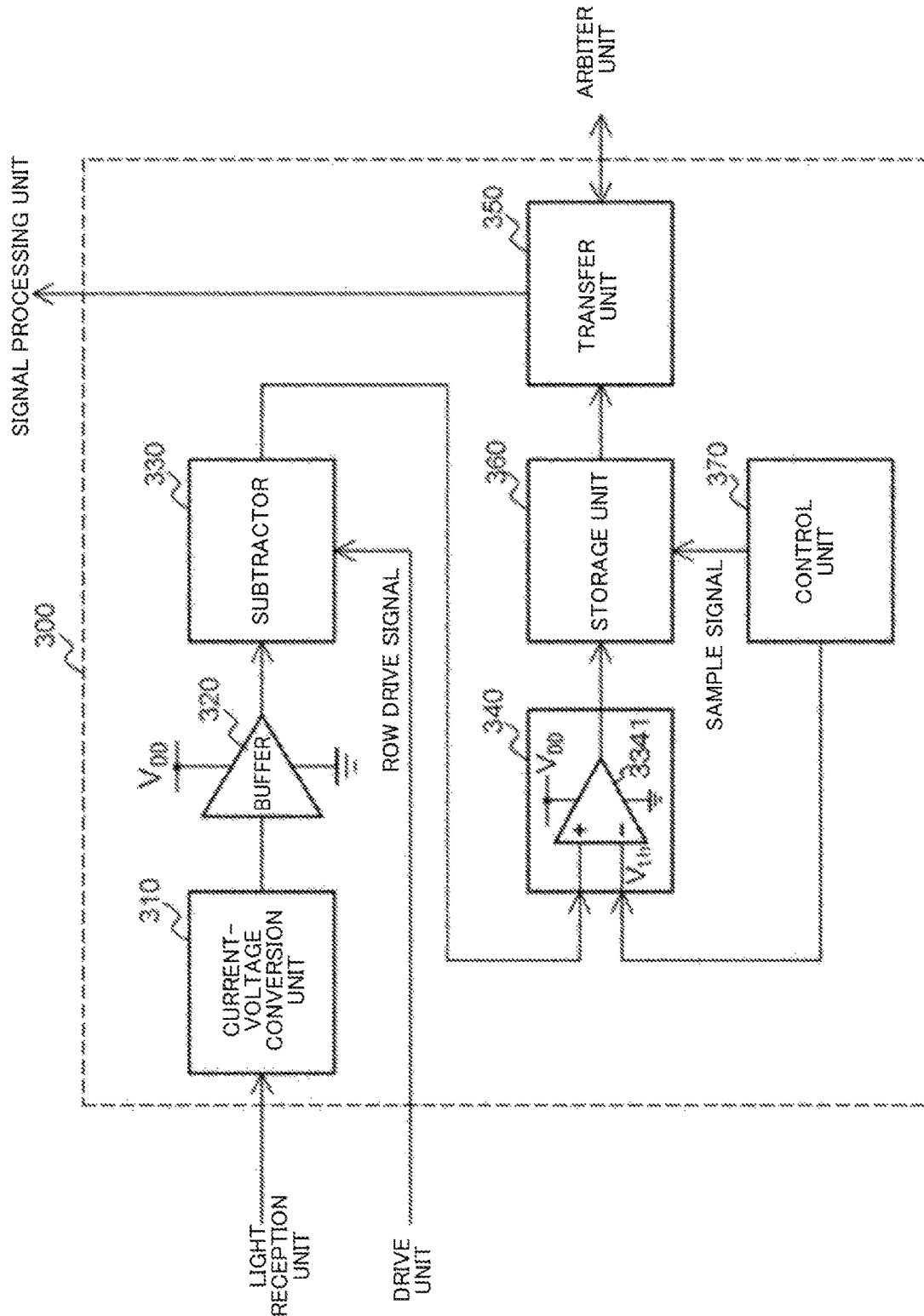
FIG. 31 is a block diagram illustrating another configuration example of the address event detection circuit.

In the first embodiment described above, for example, the imaging device 1 including the address event detection circuit 300 of FIG. 24 has been described, but an internal configuration of the address event detection circuit 300 is not necessarily limited to FIG. 24. FIG. 31 is a block diagram illustrating another configuration example of the address event detection circuit 300. The address event detection circuit 300 according to the configuration example of FIG. 31 includes a storage unit 360 and a control unit 370, in addition to the current-voltage conversion circuit 310, the buffer 320, the subtractor 330, the quantizer 340, and the transfer circuit 350. Hereinafter, the imaging device 1 including the address event detection circuit 300 of FIG. 24 is referred to as a first configuration example, and the imaging device 1 including the address event detection circuit 300 of FIG. 313 is referred to as a second configuration example.

The storage unit 360 is provided between the quantizer 340 and the transfer circuit 350, and stores an output of the quantizer 340, that is, a comparison result of the comparator 3341 in the quantizer 340, on the basis of a sample signal supplied from the control unit 370. The storage unit 360 may be a sampling circuit such as a switch, plastic, or a capacitor, or may be a digital memory circuit such as a latch or flip-flop.

The control unit 370 supplies a predetermined threshold voltage $V_{th}$ to an inverting (−) input terminal of the comparator 3341. The threshold voltage $V_{th}$ supplied from the control unit 370 to the comparator 3341 may have different voltage values in time division. For example, the control unit 370 supplies a threshold voltage $V_{th1}$ corresponding to an on-event indicating that an amount of change in the photocurrent has exceeded an upper limit threshold value, and a threshold voltage $V_{th2}$ corresponding to an off-event indicating that the amount of change falls below a lower limit threshold value at different timings, making it possible to detect a plurality of types of address events with one comparator 3341.

The storage unit 360 may store, for example, the comparison result of the comparator 3341 that has used the threshold voltage $V_{th1}$ corresponding to the on-event, during a period in which the threshold voltage $V_{th2}$ corresponding to the off-event is supplied from the control unit 370 to the inverting (−) input terminal of the comparator 3341. The storage unit 360 may be inside a pixel 216 or outside the pixel 216. Further, the storage unit 360 is not an essential component of the address event detection circuit 300. That is, the storage unit 360 may be omitted.

[Imaging Device 1 (of Scan Type) According to Second Configuration Example]

The imaging device 210 including the first configuration example of the address event detection circuit 300 illustrated in FIG. 24 described above is an imaging device 1 of an asynchronous type that reads out an event using an asynchronous type read-out scheme. However, an event readout scheme is not limited to an asynchronous readout scheme, and may be a synchronous readout scheme. The imaging device 1 to which the synchronous readout scheme is applied is an imaging device 1 of a scan type that is the same as a normal imaging device 1 that performs imaging at a predetermined frame rate.

Figure 32:
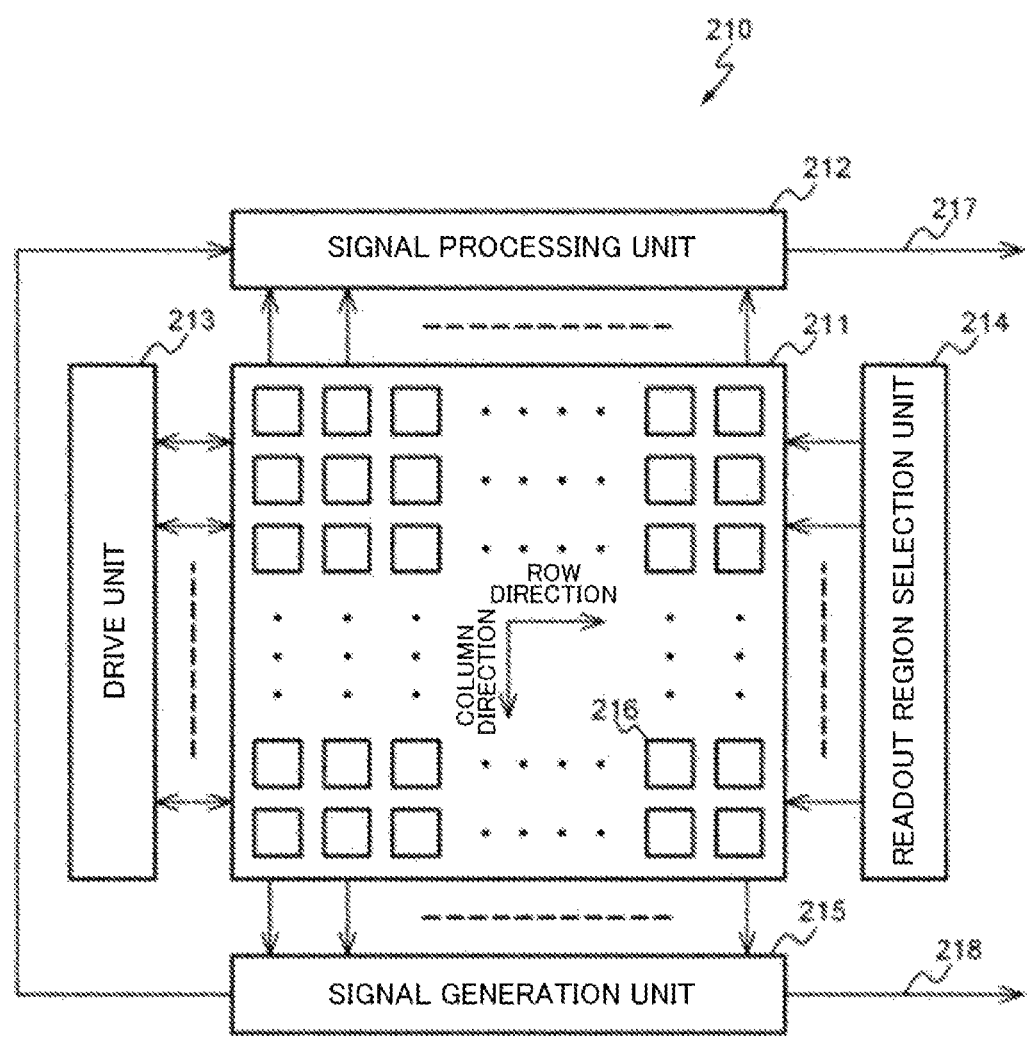
FIG. 32 is a block diagram illustrating a configuration of an imaging device according to a second configuration example.

FIG. 32 is a block diagram illustrating an example of a configuration of the imaging device 1 according to the second configuration example, that is, an imaging device 1 of a scan type, which is used as the imaging device 210 in an imaging system to which the technology according to the present disclosure is applied.

As illustrated in FIG. 32, the imaging device 210 according to the second configuration example as the imaging device 1 of the present disclosure includes a pixel array unit 211, a signal processing unit 212, a drive unit 213, a readout region selection unit 214, and a signal generation unit 215.

The pixel array unit 211 includes a plurality of pixels 216. The plurality of pixels 216 output an output signal in response to a selection signal of the readout region selection unit 214. Each of the plurality of pixels 216 may be configured to have a quantizer in the pixel, for example, as illustrated in FIG. 24. The plurality of pixels 216 output an output signal corresponding to an amount of change in light intensity. The plurality of pixels 216 may be two-dimensionally disposed in a matrix form, as illustrated in FIG. 32.

The drive unit 213 drives each of the plurality of pixels 216 to cause a pixel signal generated by each pixel 216 to be output to the signal processing unit 212. The drive unit 213 and the signal processing unit 212 are circuit units for acquiring gradation information. Therefore, when only event information is acquired, the drive unit 213 and the signal processing unit 212 may be omitted.

The readout region selection unit 214 selects some of the plurality of pixels 216 included in the pixel array unit 211. For example, the readout region selection unit 214 selects any one or a plurality of rows included in a structure of a two-dimensional matrix corresponding to the pixel array unit 211. The readout region selection unit 214 sequentially selects one or a plurality of rows according to a preset cycle. Further, the readout region selection unit 214 may determine a selection area in response to a request from each pixel 216 of the pixel array unit 211.

The signal generation unit 215 generates an event signal corresponding to an active pixel that has detected an event among the selected pixels, on the basis of the output signal of the pixel selected by the readout region selection unit 214. The event is an event in which the intensity of light changes. The active pixel is a pixel in which an amount of change in intensity of light corresponding to the output signal exceeds or falls below a preset threshold value. For example, the signal generation unit 215 compares the output signal of the pixel with a reference signal, detects an active pixel that outputs the output signal when the output signal is larger or smaller than the reference signal, and generates an event signal corresponding to the active pixel.

The signal generation unit 215 can be configured to include, for example, a column selection circuit for arbitrating a signal input to the signal generation unit 215. Further, the signal generation unit 215 can be configured to output not only information on the active pixel that has detected an event but also information on an inactive pixel that has not detected an event.

The signal generation unit 215 outputs address information and time stamp information (for example, (X, Y, T)) of the active pixel that has detected the event through an output line 218. However, data output from the signal generation unit 215 may be not only the address information and the time stamp information, but also frame format information (for example, (0, 0, 1, 0, . . . )).

[Configuration Example of Column Processing Unit]

The configuration example in which an analog-to-digital converter (ADC) including the comparator 21, the counter 23, and the memory 27 is disposed in one-to-one correspondence with a pixel column of the pixel array unit 2 in the column processing unit 4 has been illustrated in FIG. 11, but the present invention is not limited to this configuration example. For example, a configuration in which the analog-to-digital converter (ADC) is disposed in units of a plurality of pixel columns and used in a time division manner among the plurality of pixel columns can also be adopted.

The analog-to-digital converter (ADC) converts an analog pixel signal SIG supplied via a vertical signal line VSL into a digital signal having a larger number of bits than the address event detection signal described above. For example, when the address event detection signal is 2 bits, the pixel signal is converted into a digital signal having 3 bits or more (for example, 16 bits). The analog-to-digital converter (ADC) supplies the digital signal generated through the analog-to-digital conversion to the signal processing unit 212.

[Noise Event]

Incidentally, the imaging device 1 according to the first configuration example is an asynchronous imaging device 1 in which a detection unit (that is, the address event detection circuit 300) that detects, in real time, that a light amount of the pixel exceeds a predetermined threshold value for each pixel address, as an address event, can be provided in at least some of the pixel circuits 2a.

In the imaging device 1 of an asynchronous type according to the first configuration example, originally, when some event (that is, a true event) occurs in a scene, acquisition of data caused by the occurrence of the true event is performed. However, in the imaging device 1 of an asynchronous type, even in a scene in which no true event occurs, acquisition of data may be unnecessarily performed due to a noise event (false event) such as sensor noise. Accordingly, a noise signal is not only read out, but also a throughput of a signal output is degraded.

<Application Example of Technology According to the Present Disclosure>

The technology according to the present disclosure can be applied to various products. Hereinafter, a more specific application example will be described. For example, the technology according to the present disclosure may be realized as a distance measurement device mounted on any kind of mobile object such as an automobile, an electric vehicle, a hybrid electric vehicle, a motorcycle, a bicycle, a personal mobility, an airplane, a drone, a ship, a robot, a construction machine, and an agricultural machine (tractor).

[Mobile Object]

Figure 33:
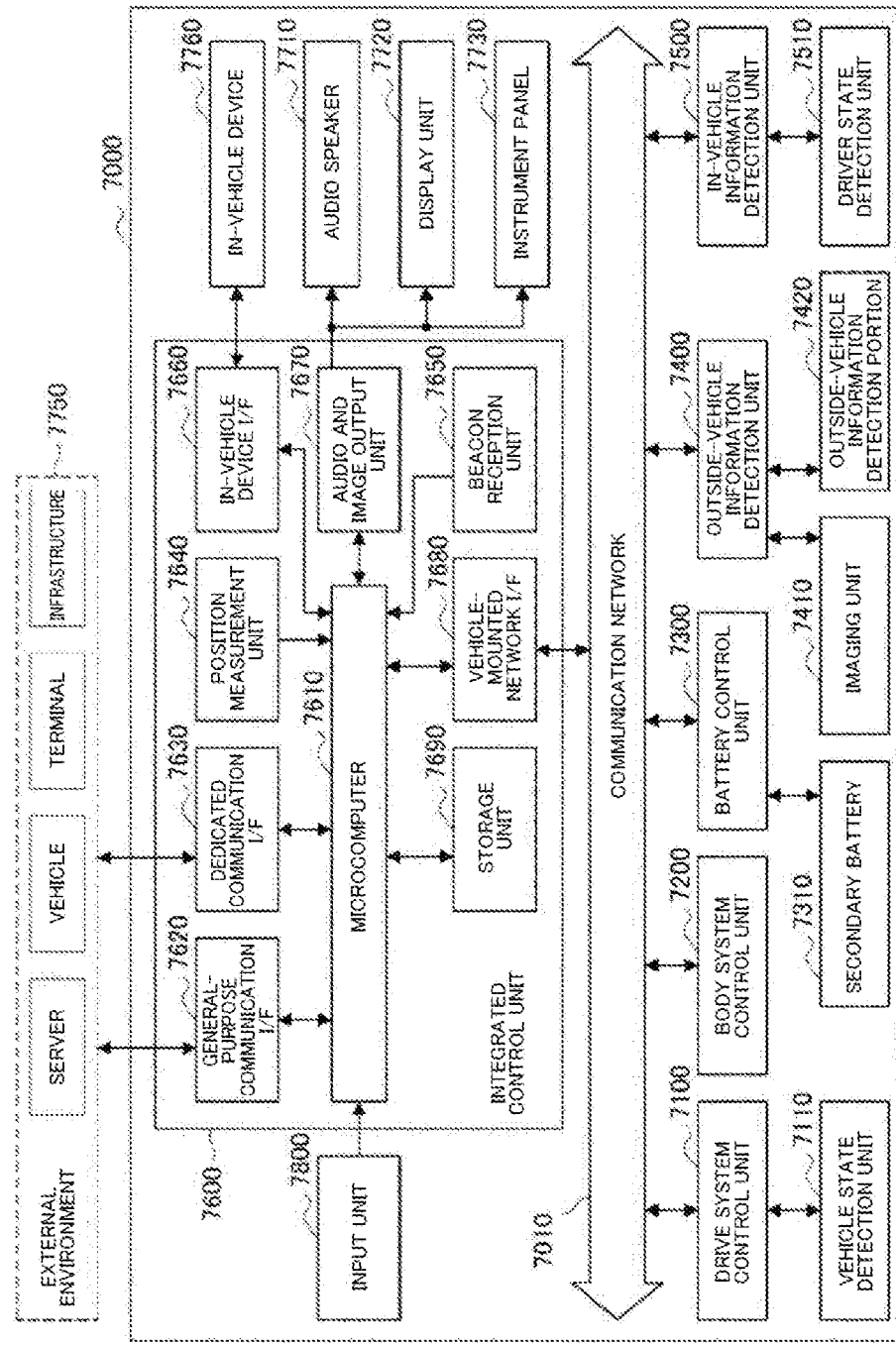
FIG. 33 is a block diagram illustrating a schematic configuration example of a vehicle control system.

FIG. 33 is a block diagram illustrating a schematic configuration example of a vehicle control system 7000, which is an example of a mobile object control system to which the technology according to the present disclosure can be applied. The vehicle control system 7000 includes a plurality of electronic control units connected via a communication network 7010. In the example illustrated in FIG. 33, the vehicle control system 7000 includes a drive system control unit 7100, a body system control unit 7200, a battery control unit 7300, an outside-vehicle information detection unit 7400, an in-vehicle information detection unit 7500, and an integrated control unit 7600. The communication network 7010 connecting the plurality of control units may be a vehicle-mounted communication network conforming to any standard such as a controller area network (CAN), a local interconnect network (LIN), a local area network (LAN), or FlexRay (registered trademark).

Each control unit includes a microcomputer that performs calculation processing according to various programs, a storage unit that stores programs to be executed by the microcomputer, parameters to be used for various calculations, or the like, and a drive circuit that drives various devices that are control targets. Each control unit includes a network I/F for performing communication with another control unit via the communication network 7010, and includes a communication I/F for performing communication with devices or sensors inside or outside the vehicle through wired communication or wireless communication. A microcomputer 7610, a general-purpose communication I/F 7620, a dedicated communication I/F 7630, a position measurement unit 7640, a beacon reception unit 7650, an in-vehicle device I/F 7660, an audio and image output unit 7670, a vehicle-mounted network I/F 7680, and a storage unit 7690 are illustrated as a functional configuration of the integrated control unit 7600 in FIG. 33. Other control units also include a microcomputer, a communication I/F, a storage unit, and the like.

The drive system control unit 7100 controls an operation of a device related to a drive system of a vehicle according to various programs. For example, the drive system control unit 7100 functions as a control device for a driving force generation device for generating driving force for the vehicle, such as an internal combustion engine or a drive motor, a driving force transmission mechanism for transmitting the driving force to wheels, a steering mechanism for adjusting a steering angle of the vehicle, a braking device that generates braking force for the vehicle, and the like. The drive system control unit 7100 may have a function of a control device for antilock brake system (ABS), electronic stability control (ESC), or the like.

The vehicle state detection unit 7110 is connected to the drive system control unit 7100. At least one of a gyro sensor that detects an angular velocity of an axial rotation motion of a vehicle body, an acceleration sensor that detects an acceleration of the vehicle, and sensors that detect an operation amount of an accelerator pedal, an operation amount of a brake pedal, a steering angle of a steering wheel, an engine speed, a rotation speed of wheels, and the like, for example, is included in the vehicle state detection unit 7110. The drive system control unit 7100 performs calculation processing using a signal input from the vehicle state detection unit 7110, to control an internal combustion engine, a drive motor, an electric power steering device, a brake device, and the like.

The body system control unit 7200 controls an operation of various devices mounted on the vehicle body according to various programs. For example, the body system control unit 7200 functions as a control device for a keyless entry system, a smart key system, a power window device, or a control device for various lamps such as headlamps, back lamps, brake lamps, turn signals, or fog lamps. In this case, a radio wave transmitted from a portable device that substitutes for a key or signals of various switches may be input to the body system control unit 7200. The body system control unit 7200 receives inputs of these radio waves or signals and controls a door lock device, a power window device, a lamp, and the like of the vehicle.

The battery control unit 7300 controls a secondary battery 7310 that is a power supply source for the drive motor according to various programs. For example, information such as a battery temperature, a battery output voltage, or a remaining capacity of the battery from a battery device including the secondary battery 7310 is input to the battery control unit 7300. The battery control unit 7300 performs calculation processing using these signals, and performs temperature adjustment control for the secondary battery 7310 or control of a cooling device included in the battery device, or the like.

The outside-vehicle information detection unit 7400 detects information on the outside of the vehicle having the vehicle control system 7000 mounted thereon. For example, at least one of an imaging unit 7410 and an outside-vehicle information detection portion 7420 is connected to the outside-vehicle information detection unit 7400. At least one of a time of flight (ToF) camera, a stereo camera, a monocular camera, an infrared camera, and other cameras is included in the imaging unit 7410. At least one of an environment sensor for detecting a current weather or a surroundings information detection sensor for detecting other vehicles, obstacles, pedestrians, or the like around the vehicle having the vehicle control system 7000 mounted thereon, for example, is included in the outside-vehicle information detection portion 7420.

The environment sensor may be, for example, at least one of a raindrop sensor that detects rainy weather, a fog sensor that detects fog, a sunshine sensor that detects a degree of sunshine, and a snow sensor that detects snowfall. The surroundings information detection sensor may be at least one of an ultrasonic sensor, a radar device, and a light detection and ranging or laser imaging detection and ranging (LIDAR) device. The imaging unit 7410 and the outside-vehicle information detection portion 7420 may be included as independent sensors or devices, or may be included as a device in which a plurality of sensors or devices are integrated.

Figure 34:
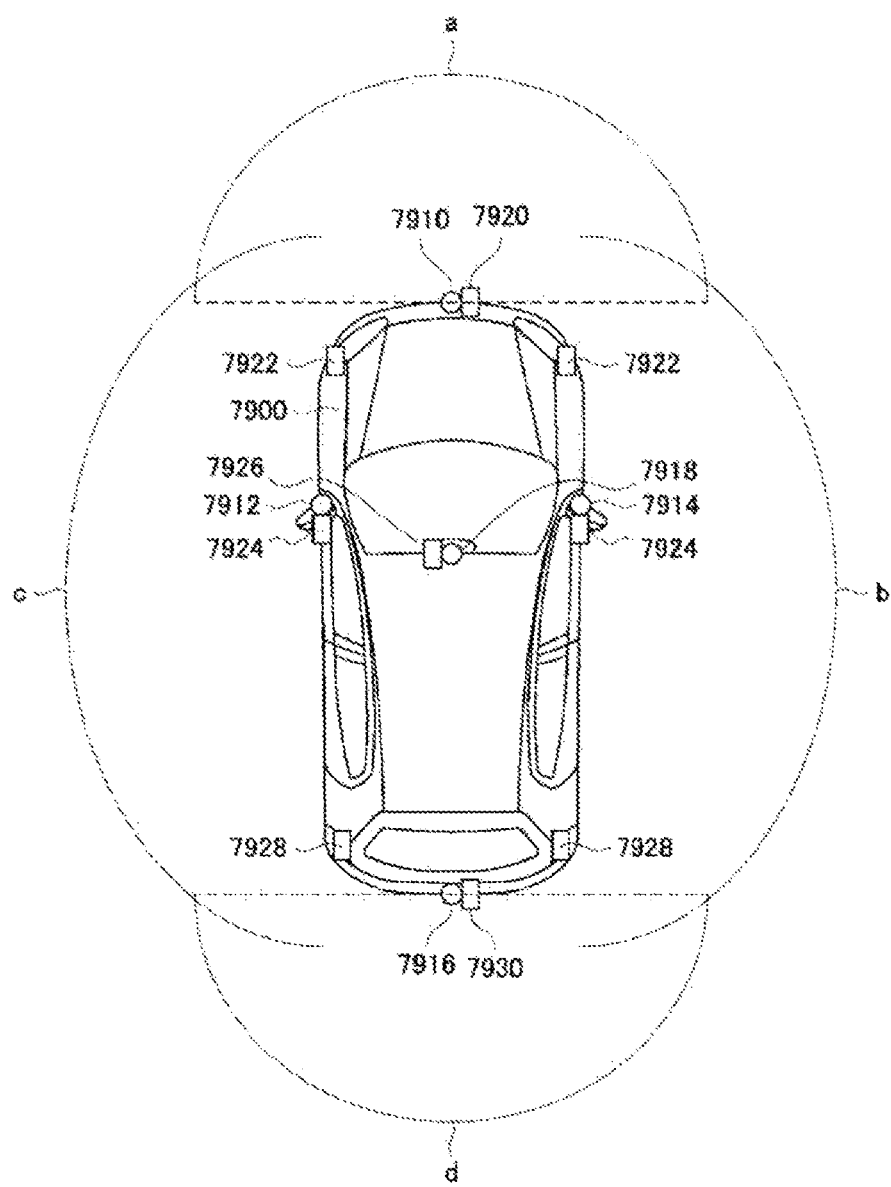
FIG. 34 is a diagram illustrating an example of installation positions of an imaging unit and an outside-vehicle information detection unit.

Here, FIG. 34 illustrates an example of installation positions of the imaging unit 7410 and the outside-vehicle information detection portion 7420. Imaging units 7910, 7912, 7914, 7916, and 7918 are provided, for example, at at least one of a front nose, a side mirror, a rear bumper, a back door, and an upper part of a windshield of a vehicle cabin of a vehicle 7900. The imaging unit 7910 included at the front nose and the imaging unit 7918 included in the upper part of the windshield in the vehicle cabin mainly acquire an image of front of the vehicle 7900. The imaging units 7912 and 7914 provided at the side mirrors mainly acquire images of the side of the vehicle 7900. The imaging unit 7916 provided in the rear bumper or the back door mainly acquires an image of the rear of the vehicle 7900. The imaging unit 7918 provided at the upper part of the windshield in the vehicle cabin is mainly used for detection of a preceding vehicle, a pedestrian, an obstacle, a traffic light, a traffic sign, a lane, or the like.

In addition, FIG. 34 illustrates an example of photographing ranges of the respective imaging units 7910, 7912, 7914, and 7916. An imaging range a indicates the imaging range of the imaging unit 7910 provided at the front nose, imaging ranges b and c indicate the imaging ranges of the imaging units 7912 and 7914 provided on the side mirrors, and an imaging range d indicates the imaging range of the imaging unit 7916 provided on the rear bumper or the back door. For example, a bird's-eye view image of the vehicle 7900 can be obtained by superimposing image data captured by the imaging units 7910, 7912, 7914, and 7916.

Outside-vehicle information detection units 7920, 7922, 7924, 7926, 7928, and 7930 provided in a front, a rear, a side, a corner, and an upper part of the windshield in the vehicle cabin of the vehicle 7900 may be, for example, ultrasonic sensors or radar devices. The outside-vehicle information detection units 7920, 7926, and 7930 provided at the front nose, the rear bumper, the back door, and the upper part of the windshield in the vehicle cabin of the vehicle 7900 may be, for example, LIDAR devices. These outside-vehicle information detection units 7920 to 7930 are mainly used for detection of a preceding vehicle, a pedestrian, an obstacle, or the like.

Returning to FIG. 33, the description will be continued. The outside-vehicle information detection unit 7400 causes the imaging unit 7410 to capture an image of the outside of the vehicle and receives captured image data. Further, the outside-vehicle information detection unit 7400 receives detection information from the connected outside-vehicle information detection portion 7420. When the outside-vehicle information detection portion 7420 is an ultrasonic sensor, a radar device, or a LIDAR device, the outside-vehicle information detection unit 7400 causes ultrasonic waves, electromagnetic waves, or the like to be transmitted, and receives received reflected wave information. The outside-vehicle information detection unit 7400 may perform object detection processing or distance detection processing for a person, a vehicle, an obstacle, a sign, a character on a road surface, or the like on the basis of the received information. The outside-vehicle information detection unit 7400 may perform environment recognition processing for recognizing rainfall, fog, road surface situation, and the like on the basis of the received information. The outside-vehicle information detection unit 7400 may calculate a distance to an object outside the vehicle on the basis of the received information.

Further, the outside-vehicle information detection unit 7400 may perform image recognition processing or distance detection processing for recognizing a person, a vehicle, an obstacle, a sign, a character on a road surface, or the like on the basis of the received image data. The outside-vehicle information detection unit 7400 may perform processing such as distortion correction or alignment on the received image data, and synthesize image data captured by different imaging units 7410 to generate a bird's-eye view image or a panoramic image. The outside-vehicle information detection unit 7400 may perform viewpoint conversion processing using the image data captured by different imaging units 7410.

The in-vehicle information detection unit 7500 detects information in the vehicle. A driver state detection unit 7510 that detects a state of the driver, for example, is connected to the in-vehicle information detection unit 7500. The driver state detection unit 7510 may include a camera that images the driver, a biosensor that detects biological information of the driver, a microphone that collects sound in the vehicle cabin, and the like. The biosensor is provided on, for example, on a seat surface or a steering wheel, and detects biological information of a passenger sitting on a seat or a driver holding the steering wheel. The in-vehicle information detection unit 7500 may calculate a degree of fatigue or a degree of concentration of the driver on the basis of detection information input from the driver state detection unit 7510, and may determine whether the driver is asleep. The in-vehicle information detection unit 7500 may perform processing such as noise canceling processing on the collected audio signal.

The integrated control unit 7600 controls an overall operation in the vehicle control system 7000 according to various programs. An input unit 7800 is connected to the integrated control unit 7600. The input unit 7800 is realized by a device that can be operated for input by the passenger, such as a touch panel, a button, a microphone, a switch, or a lever. Data obtained by recognizing voice input by the microphone may be input to the integrated control unit 7600. The input unit 7800 may be, for example, a remote control device using infrared rays or other radio waves, or may be an external connection device such as a mobile phone or a personal digital assistant (PDA) corresponding to an operation of the vehicle control system 7000. The input unit 7800 may be, for example, a camera, and in this case, the passenger can input information by gesture. Alternatively, data obtained by detecting a motion of a wearable device worn by the passenger may be input. Further, the input unit 7800 may include, for example, an input control circuit that generates an input signal on the basis of information input by the passenger or the like using the input unit 7800 and outputs the input signal to the integrated control unit 7600. The passenger or the like inputs various types of data to the vehicle control system 7000 or instructs a processing operation by operating the input unit 7800.

The storage unit 7690 may include a read only memory (ROM) that stores various programs to be executed by the microcomputer, and a random access memory (RAM) that stores various parameters, calculation results, sensor values, and the like. Further, the storage unit 7690 may be realized by a magnetic storage device such as a hard disc drive (HDD), a semiconductor storage device, an optical storage device, an optical magnetic storage device, or the like.

The general-purpose communication I/F 7620 is a general-purpose communication I/F that mediates communication with various devices in an external environment 7750. In the general-purpose communication I/F 7620, a cellular communication protocol such as global system of mobile communications (GSM (registered trademark)), WiMAX, long term evolution (LTE), or LTE-Advanced (LTE-A), or other wireless communication protocols such as wireless LAN (also referred to as Wi-Fi (registered trademark)) or Bluetooth (registered trademark) may be implemented. The general-purpose communication I/F 7620 may connect to a device (for example, an application server or a control server) present on an external network (for example, the Internet, a cloud network, or a business-specific network) via a base station or an access point, for example. Further, the general-purpose communication I/F 7620 may be connected with a terminal (for example, a terminal of a driver, a pedestrian, or a store, or a machine type communication (MTC) terminal) present near the vehicle using, for example, peer to peer (P2P) technology.

The dedicated communication I/F 7630 is a communication I/F that supports a communication protocol designed for use in a vehicle. In the dedicated communication I/F 7630, for example, wireless access in vehicle environment (WAVE), which is a combination of IEEE802.11p of a lower layer and IEEE1609 of an upper layer, dedicated short range communications (DSRC), or a standard protocol such as a cellular communication protocol may be implemented. The dedicated communication I/F 7630, typically, performs V2X communication that is a concept including one or more of vehicle to vehicle communication, vehicle to infrastructure communication, vehicle to home communication, and vehicle to pedestrian communication.

The position measurement unit 7640 receives, for example, a GNSS signal from a global navigation satellite system (GNSS) satellite (for example, a GPS signal from a global positioning system (GPS) satellite), executes position measurement, and generates position information including a latitude, longitude, and altitude of the vehicle. The position measurement unit 7640 may specify a current position through exchange of signals with a wireless access point, or may acquire position information from a terminal such as a mobile phone, PHS, or smartphone having a position measurement function.

The beacon reception unit 7650 receives, for example, radio waves or electromagnetic waves transmitted from, for example, a radio station installed on a road, and acquires information such as a current position, traffic jam, road closure, or a required time. A function of the beacon reception unit 7650 may be included in the dedicated communication I/F 7630 described above.

The in-vehicle device I/F 7660 is a communication interface that mediates a connection between the microcomputer 7610 and various in-vehicle devices 7760 present in the vehicle. The in-vehicle device I/F 7660 may establish a wireless connection using a wireless communication protocol such as wireless LAN, Bluetooth (registered trademark), near field communication (NFC), or wireless USB (WUSB). Further, the in-vehicle device I/F 7660 may establish a wired connection such as a universal serial bus (USB), a high-definition multimedia interface (HDMI (registered trademark)), or a mobile high-definition link (MHL) via a connection terminal that is not illustrated (and a cable when necessary). The in-vehicle device 7760 may include, for example, at least one of a mobile device or wearable device of a passenger, and an information device carried in or attached to the vehicle. Further, the in-vehicle device 7760 may include a navigation device that performs search for a route to an arbitrary destination. The in-vehicle device I/F 7660 exchanges a control signal or a data signal with these in-vehicle devices 7760.

The vehicle-mounted network I/F 7680 is an interface that mediates communication between the microcomputer 7610 and the communication network 7010. The vehicle-mounted network I/F 7680 transmits or receives signals and the like according to a predetermined protocol supported by the communication network 7010.

The microcomputer 7610 of the integrated control unit 7600 controls the vehicle control system 7000 according to various programs on the basis of information acquired via at least one of the general-purpose communication I/F 7620, the dedicated communication I/F 7630, the position measurement unit 7640, the beacon reception unit 7650, the in-vehicle device I/F 7660, and the vehicle-mounted network I/F 7680. For example, the microcomputer 7610 calculates a control target value of the driving force generation device, the steering mechanism, or the braking device on the basis of the acquired in- and outside-vehicle information, and output a control command to the drive system control unit 7100. For example, the microcomputer 7610 performs cooperative control for the purpose of realization of functions of an advanced driver assistance system (ADAS) including vehicle collision avoidance or impact mitigation, follow-up traveling based on an inter-vehicle distance, vehicle speed maintenance traveling, vehicle collision warning, vehicle lane deviation warning, and the like. Further, the microcomputer 7610 may perform coordinative control aiming at, for example, autonomous driving in which the vehicle travels autonomously without relying on an operation of a driver by controlling the driving force generation device, the steering mechanism, the braking device, or the like on the basis of the acquired information on surroundings of the vehicle.

The microcomputer 7610 may generate three-dimensional distance information between the vehicle and an object such as a surrounding structure or a person, on the basis of the information acquired via at least one of the general-purpose communication I/F 7620, the dedicated communication I/F 7630, the position measurement unit 7640, the beacon reception unit 7650, the in-vehicle device I/F 7660, and the vehicle-mounted network I/F 7680, and create local map information including information on surroundings of a current position of the vehicle. Further, the microcomputer 7610 may predict danger such as collision of the vehicle, a pedestrian or the like approaching or entering a closed road on the basis of the acquired information and generate a warning signal. The warning signal may be, for example, a signal for generating a warning sound or turning on a warning lamp.

The audio and image output unit 7670 transmits an output signal of at least one of audio and an image to an output device capable of visually or audibly notifying a passenger or the outside of the vehicle of information. In the example of FIG. 33, an audio speaker 7710, a display unit 7720, and an instrument panel 7730 are exemplified as the output device. The display unit 7720 may include, for example, at least one of an onboard display and a head-up display. The display unit 7720 may have an augmented reality (AR) display function. The output device may be another device other than such devices, such as a headphone, a wearable device such as an eyeglass-type display worn by the passenger, a projector, or a lamp. When the output device is a display device, the display device visually displays results obtained through various processing performed by the microcomputer 7610 or information received from other control units, in various formats such as texts, images, tables, and graphs. When the output device is an audio output device, the audio output device converts an audio signal including reproduced audio data, acoustic data, or the like into an analog signal, and audibly outputs the audio signal.

In the example illustrated in FIG. 33, at least two control units connected via the communication network 7010 may be integrated as one control unit. Alternatively, each control unit may be configured of a plurality of control units. Further, the vehicle control system 7000 may include another control unit (not illustrated). Further, in the above description, the other control unit may have some or all of functions of any one of the control units. That is, predetermined calculation processing may be performed by any one of the control units as long as information is transmitted and received via the communication network 7010. Similarly, a sensor or device connected to any one of the control units may be connected to the other control unit, and a plurality of control units may transmit or receive detection information to and from each other via the communication network 7010.

The example of the vehicle control system to which the technology according to the present disclosure can be applied has been described above. The technology according to the present disclosure can be applied to, for example, the imaging units 7910, 7912, 7914, 7916, and 7918, the outside-vehicle information detection units 7920, 7922, 7924, 7926, 7928, and 7930, the driver state detection unit 7510, or the like in the configurations described above. Specifically, an imaging system 10 of FIG. 1 having the imaging device 1 of the present disclosure can be applied to the imaging units or detection units. Because an influence of noise events such as sensor noise can be mitigated and occurrence of true events can be sensed reliably and rapidly by applying the technology according to the present disclosure, it becomes possible to realize safe vehicle traveling.

The present technology can have the following configurations.

(1) An imaging device including a plurality of substrates to be stacked, the imaging device including:

a readout-only circuit disposed on a substrate different from a substrate having a pixel array unit including a plurality of photoelectric conversion elements disposed thereon, and configured to perform an operation of reading out electrical signals obtained through photoelectric conversion in the plurality of photoelectric conversion elements; and a circuit disposed on a substrate different from the substrate having the readout-only circuit disposed thereon and configured to perform an operation other than an operation of the readout-only circuit on the basis of the electrical signals.

(2) The imaging device according to (1), wherein the readout-only circuit is a circuit configured to convert the electrical signal obtained through photoelectric conversion in the photoelectric conversion element into a voltage signal and perform gain adjustment, and the substrate having a circuit configured to perform the operation other than the operation of the readout-only circuit disposed thereon performs at least one of processing for converting the voltage signal output from the readout-only circuit into a digital signal in units of two or more pixel groups disposed in a first direction of the pixel array unit, predetermined signal processing for the digital signal, and processing for driving the plurality of photoelectric conversion elements in units of two or more pixel groups disposed in a second direction.

(3) The imaging device according to (1) or (2), wherein a circuit portion having a power supply voltage exceeding a predetermined reference voltage in the circuit configured to perform the operation other than the operation of the readout-only circuit is disposed on the same substrate as that for the plurality of photoelectric conversion elements.

(4) The imaging device according to (3), including at least a part of an AD unit disposed on the substrate having the pixel array unit disposed thereon and configured to convert a pixel signal read from the readout-only circuit into a digital signal.

(5) The imaging device according to (4), wherein the AD unit converts a pixel signal read from the readout-only circuit into the digital signal in units of two or more pixel groups disposed in a first direction of the pixel array unit.

(6) The imaging device according to (4) or (5), wherein the AD unit is divided and disposed on the substrate having the pixel array unit disposed thereon and another substrate.

(7) The imaging device according to any one of (4) to (6), including a pixel group drive unit disposed on the substrate having the pixel array unit disposed thereon and configured to drive the pixel array unit in units of two or more pixel groups disposed in a second direction.

(8) The imaging device according to (7), wherein the pixel group drive unit is divided and disposed on the substrate having the pixel array unit disposed thereon and another substrate.

(9) The imaging device according to any one of (1) to (8), including:
a first substrate having the readout-only circuit disposed thereon;
a second substrate stacked on the first substrate and having the pixel array unit disposed thereon; and
a third substrate stacked at the same layer height as the second substrate on the first substrate and having at least a part of the circuit configured to perform the operation other than the operation of the readout-only circuit disposed thereon.

(10) The imaging device according to (9), wherein the first substrate is larger than the second substrate, and
the second substrate is larger than the third substrate.

(11) The imaging device according to any one of (1) to (8), including:
a first substrate having the readout-only circuit disposed thereon;
a second substrate stacked on the first substrate and having the pixel array unit disposed thereon; and
a third substrate stacked under the first substrate and having at least a part of the circuit configured to perform the operation other than the operation of the readout-only circuit disposed thereon.

(12) The imaging device according to (11), including:
a fourth substrate disposed at the same layer height as the third substrate,
wherein respective parts of the circuit configured to perform the operation other than the operation of the readout-only circuit are disposed on the third substrate and the fourth substrate.

(13) The imaging device according to (12), wherein the second substrate is larger than the third substrate and the fourth substrate.

(14) The imaging device according to any one of (9) to (13), wherein the readout-only circuit is disposed on the first substrate to at least partially overlap the pixel array unit when viewed in a plan view of the first substrate and the second substrate in a stacking direction.

(15) The imaging device according to any one of (9) to (14), wherein the readout-only circuit is provided in each of the plurality of photoelectric conversion elements.

(16) The imaging device according to any one of (9) to (14), wherein the readout-only circuit is provided in association with two or more of the photoelectric conversion elements.

(17) The imaging device according to any one of (1) to (16), wherein the pixel array unit and the readout-only circuit include a change amount detection unit configured to output a detection signal indicating whether or not a change amount of the electrical signal of each of the plurality of photoelectric conversion elements exceeds a predetermined threshold value.

(18) The imaging device according to any one of (1) to (16), wherein the pixel array unit and the readout-only circuit include a pixel AD unit configured to convert the electrical signal obtained through photoelectric conversion in each of the photoelectric conversion elements into a digital signal.

(19) The imaging device according to any one of (1) to (16), wherein the pixel array unit and the readout-only circuit include a light detection unit configured to detect an incidence position and an incidence time of light incident on the plurality of photoelectric conversion elements.

(20) The imaging device according to any one of (1) to (19), including:
a first output unit configured to output a first signal from the pixel array unit; and
a second output unit configured to output a second signal from the readout-only circuit.

(21) The imaging device according to any one of (1) to (20), wherein the plurality of substrates are bonded through at least one of Cu—Cu bonding, through silicon via (TSV), and bump bonding.

(22) The imaging device according to any one of (1) to (21), wherein the substrate is a wafer or a semiconductor chip.

(23) An imaging method including a plurality of substrates to be stacked, the imaging method including:
performing an operation of reading out electrical signals obtained through photoelectric conversion in a plurality of photoelectric conversion elements in a readout-only circuit disposed on a substrate different from a substrate having a pixel array unit including the plurality of photoelectric conversion elements disposed thereon; and
performing an operation other than an operation of the readout-only circuit on the basis of the electrical signals in a circuit disposed on a substrate different from the substrate having the readout-only circuit disposed thereon.

The aspects of the present disclosure are not limited to the individual embodiments described above and include various modification examples that can be conceived by those skilled in the art, and effects of the present disclosure are not limited to the above-described content. That is, various additions, changes, and partial deletions can be performed without departing from the conceptual idea and spirit of the present disclosure derived from content specified in the claims and equivalents thereof.

REFERENCE SIGNS LIST

1 Imaging device
2 Pixel array unit
3 Row drive unit
4 Column processing unit
5 Pixel AFE unit
6 Column drive unit
7 Signal processing unit
8 System control unit
9 Signal processing unit
11 First substrate
12 Second substrate
21 Comparator
23 Up/down counter
24 Memory
25 Address selection logic unit
26 Decoder 27 Memory
28 Level shifter
29 Driver
300 Address event detection circuit
31 Photoelectric conversion element
32 Transfer transistor
33 Reset transistor
36 Amplification transistor
37 Selection transistor
210 Imaging device
211 Pixel array unit
212 Signal processing unit
213 Drive unit
214 Readout region selection unit
215 Signal generation unit
310 Current-voltage conversion circuit
320 Buffer
330 Subtractor
340 Quantizer
350 Transfer circuit
400 Address event detector
410 Current-voltage converter
420 Buffer
430 Subtractor
431, 433 Capacitor
432 Inverter
434 Switch
440 Quantizer
441 Comparator
450 Transfer unit
12031 Imaging unit

What is claimed is:

1. An imaging device including a plurality of substrates to be stacked, the imaging device comprising:
 a readout-only circuit disposed on a substrate different from a substrate having a pixel array unit including a plurality of photoelectric conversion elements disposed thereon, and configured to perform an operation of reading out electrical signals obtained through photoelectric conversion in the plurality of photoelectric conversion elements; and
 a circuit disposed on a substrate different from the substrate having the readout-only circuit disposed thereon and configured to perform an operation other than an operation of the readout-only circuit based on the electrical signals, wherein a circuit portion having a power supply voltage exceeding a predetermined reference voltage in the circuit configured to perform the operation other than the operation of the readout-only circuit is disposed on a same substrate as that for the plurality of photoelectric conversion elements.

2. The imaging device according to claim 1,
 wherein the readout-only circuit is a circuit configured to convert the electrical signal obtained through photoelectric conversion in the photoelectric conversion element into a voltage signal and perform gain adjustment, and
 the substrate having a circuit configured to perform the operation other than the operation of the readout-only circuit disposed thereon performs at least one of processing for converting a voltage signal output from the readout-only circuit into a digital signal in units of two or more pixel groups disposed in a first direction of the pixel array unit, predetermined signal processing for the digital signal, and processing for driving the plurality of photoelectric conversion elements in units of two or more pixel groups disposed in a second direction.

3. The imaging device according to claim 1, further comprising at least a part of an AD unit disposed on the substrate having the pixel array unit disposed thereon and configured to convert a pixel signal read from the readout-only circuit into a digital signal.

4. The imaging device according to claim 3, wherein the AD unit converts a pixel signal read from the readout-only circuit into the digital signal in units of two or more pixel groups disposed in a first direction of the pixel array unit.

5. The imaging device according to claim 3, wherein the AD unit is divided and disposed on the substrate having the pixel array unit disposed thereon and another substrate.

6. The imaging device according to claim 3, further comprising a pixel group drive unit disposed on the substrate having the pixel array unit disposed thereon and configured to drive the pixel array unit in units of two or more pixel groups disposed in a second direction.

7. The imaging device according to claim 6, wherein the pixel group drive unit is divided and disposed on the substrate having the pixel array unit disposed thereon and another substrate.

8. The imaging device according to claim 1, further comprising:
 a first substrate having the readout-only circuit disposed thereon;
 a second substrate stacked on the first substrate and having the pixel array unit disposed thereon; and
 a third substrate stacked under the first substrate and having at least a part of the circuit configured to perform the operation other than the operation of the readout-only circuit disposed thereon.

9. The imaging device according to claim 1, wherein the pixel array unit and the readout-only circuit include a change amount detection unit configured to output a detection signal indicating whether or not a change amount of the electrical signal of each of the plurality of photoelectric conversion elements exceeds a predetermined threshold value.

10. The imaging device according to claim 1, wherein the pixel array unit and the readout-only circuit include a pixel AD unit configured to convert the electrical signal obtained through photoelectric conversion in each of the photoelectric conversion elements into a digital signal.

11. The imaging device according to claim 1, wherein the pixel array unit and the readout-only circuit include a light detection unit configured to detect an incidence position and an incidence time of light incident on the plurality of photoelectric conversion elements.

12. The imaging device according to claim 1, further comprising:
 a first output unit configured to output a first signal from the pixel array unit; and
 a second output unit configured to output a second signal from the readout-only circuit.

13. The imaging device according to claim 1, wherein the plurality of substrates are bonded through at least one of Cu—Cu bonding, a through silicon via (TSV), and bump bonding.

14. The imaging device according to claim 1, wherein the substrate is a wafer or a semiconductor chip.

15. An imaging device including a plurality of substrates to be stacked, the imaging device comprising:
 a readout-only circuit disposed on a substrate different from a substrate having a pixel array unit including a plurality of photoelectric conversion elements disposed thereon, and configured to perform an operation of reading out electrical signals obtained through photoelectric conversion in the plurality of photoelectric conversion elements;

a circuit disposed on a substrate different from the substrate having the readout-only circuit disposed thereon and configured to perform an operation other than an operation of the readout-only circuit based on the electrical signals;

a first substrate having the readout-only circuit disposed thereon;

a second substrate stacked on the first substrate and having the pixel array unit disposed thereon; and a third substrate stacked under the first substrate and having at least a part of the circuit configured to perform the operation other than the operation of the readout-only circuit disposed thereon; and a fourth substrate disposed at a same layer height as the third substrate, wherein respective parts of the circuit configured to perform the operation other than the operation of the readout-only circuit are disposed on the third substrate and the fourth substrate.

16. The imaging device according to claim 15, wherein the second substrate is larger than the third substrate and the fourth substrate.

17. An imaging device including a plurality of substrates to be stacked, the imaging device comprising:

a readout-only circuit disposed on a substrate different from a substrate having a pixel array unit including a plurality of photoelectric conversion elements disposed thereon, and configured to perform an operation of reading out electrical signals obtained through photoelectric conversion in the plurality of photoelectric conversion elements;

a circuit disposed on a substrate different from the substrate having the readout-only circuit disposed thereon and configured to perform an operation other than an operation of the readout-only circuit based on the electrical signals;

a first substrate having the readout-only circuit disposed thereon;

a second substrate stacked on the first substrate and having the pixel array unit disposed thereon; and a third substrate stacked at a same layer height as the second substrate on the first substrate and having at least a part of the circuit configured to perform the operation other than the operation of the readout-only circuit disposed thereon.

18. The imaging device according to claim 17, wherein the first substrate is larger than the second substrate, and wherein the second substrate is larger than the third substrate.

19. The imaging device according to claim 17, wherein the readout-only circuit is disposed on the first substrate to at least partially overlap the pixel array unit when viewed in a plan view of the first substrate and the second substrate in a stacking direction.

20. The imaging device according to claim 17, wherein the readout-only circuit is provided in each of the plurality of photoelectric conversion elements.

21. The imaging device according to claim 17, wherein the readout-only circuit is provided in association with two or more of the photoelectric conversion elements.

* * * * *